(12) United States Patent
Arakawa et al.

(10) Patent No.: US 8,100,513 B2
(45) Date of Patent: Jan. 24, 2012

(54) FERROELECTRIC FILM, PROCESS FOR PRODUCING THE SAME, FERROELECTRIC DEVICE, AND LIQUID DISCHARGE DEVICE

(75) Inventors: Takami Arakawa, Kanagawa-ken (JP); Takamichi Fujii, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 827 days.

(21) Appl. No.: 12/052,547

(22) Filed: Mar. 20, 2008

(65) Prior Publication Data

US 2008/0231667 A1  Sep. 25, 2008

(30) Foreign Application Priority Data

Mar. 22, 2007 (JP) ................. 2007-074026
Sep. 5, 2007 (JP) ................. 2007-229786
Sep. 5, 2007 (JP) ................. 2007-229787
Sep. 5, 2007 (JP) ................. 2007-229788
Sep. 5, 2007 (JP) ................. 2007-229789

(51) Int. Cl.
*B41J 2/045* (2006.01)
*H01L 41/00* (2006.01)
*C23C 14/00* (2006.01)

(52) U.S. Cl. ............ 347/68; 310/358; 204/192.18

(58) Field of Classification Search ............ 347/53, 347/68–72; 310/358; 252/62.9 PZ, 62.9 R; 204/192.18
See application file for complete search history.

(56) References Cited

U.S. PATENT DOCUMENTS

| | | | |
|---|---|---|---|
| 5,719,607 A * | 2/1998 | Hasegawa et al. | 347/70 |
| 6,916,754 B2 | 7/2005 | Sumiya et al. | |
| 7,187,025 B2 | 3/2007 | Hamada et al. | |
| 7,196,457 B2 | 3/2007 | Miyazawa et al. | |
| 2005/0236654 A1 | 10/2005 | Kijima et al. | |

FOREIGN PATENT DOCUMENTS

| | | |
|---|---|---|
| JP | 7-330425 A | 12/1995 |
| JP | 2003-55045 A | 2/2003 |
| JP | 2005-35843 A | 2/2005 |
| JP | 2005-72474 A | 3/2005 |
| JP | 2005-100660 A | 4/2005 |
| JP | 2005-101512 A | 4/2005 |
| JP | 3791614 B2 | 4/2006 |
| JP | 2006-182642 A | 7/2006 |
| JP | 2006-188427 | 7/2006 |

OTHER PUBLICATIONS

S. Takahashi "Effects of Impurity Doping in Lead Zirconate-Titanate Ceramics," Ferroelectrics, vol. 41, pp. 143-156,1982.

(Continued)

*Primary Examiner* — Geoffrey Mruk
(74) *Attorney, Agent, or Firm* — Birch, Stewart, Kolasch & Birch, LLP

(57) ABSTRACT

A ferroelectric film having a columnar structure constituted by a plurality of columnar grains, and containing as a main component a perovskite oxide which has a composition expressed by a compositional formula $A_{1+\delta}[(Zr_xTi_{1-x})_{1-y}M_y]O_z$, where A represents one or more A-site elements including lead (Pb) as a main component, M represents one or more of vanadium (V), niobium (Nb), tantalum (Ta), and antimony (Sb) as one or more B-site elements, zirconium (Zr) and titanium (Ti) are also B-site elements, $0<x\leq0.7$, $0.1\leq y\leq0.4$, $\delta$ is approximately zero, z is approximately 3, and $\delta$ and z may deviate from 0 and 3, respectively, within ranges of $\delta$ and z in which the composition expressed by the compositional formula $A_{1+\delta}[(Zr_xTi_{1-x})_{1-y}M_y]O_z$ can substantially form a perovskite structure.

19 Claims, 20 Drawing Sheets

OTHER PUBLICATIONS

T. Tanaka, et al., Atsuden Ceramics Zairyo (Piezoelectric Ceramics Materials), in Japanese, Gakkensha, Tokyo, pp. 110-131, 1973.

"Vacuum Handbook," in Japanese, edited by ULVAC Inc. and published by Ohmsha, pp. 202-205, 2002.

* cited by examiner

US 8,100,513 B2

FERROELECTRIC FILM, PROCESS FOR PRODUCING THE SAME, FERROELECTRIC DEVICE, AND LIQUID DISCHARGE DEVICE

CROSS-REFERENCE TO RELATED APPLICATIONS

The subject matters disclosed in this specification are related to the subject matters disclosed in the following, copending and co-assigned patent applications:

(i) U.S. patent application Ser. No. 11/905,130, being filed by Takamitsu Fujii (one of the inventors of the present patent application) and Yukio Sakashita on Sep. 27, 2007 and corresponding to Japanese patent application No. 2006-263978

(ii) U.S. patent application Ser. No. 11/905,101, being filed by Takamitsu Fujii (one of the inventors of the present patent application) on Sep. 27, 2007 and corresponding to Japanese patent application No. 2006-263979

(iii) U.S. patent application Ser. No. 11/905,102, being filed by Takamitsu Fujii (one of the inventors of the present patent application) on Sep. 27, 2007 and corresponding to Japanese patent application No. 2006-263980

(iv) U.S. patent application Ser. No. 11/905,046, being filed by Takamitsu Fujii (one of the inventors of the present patent application) on Sep. 27, 2007 and corresponding to Japanese patent application No. 2006-263981

The contents of the above U.S. patent applications and the corresponding Japanese patent applications are incorporated in this specification by reference.

BACKGROUND OF THE INVENTION

1. Field of the Invention

The present invention relates to a ferroelectric film, a process for producing the ferroelectric film, a ferroelectric device using the ferroelectric film, and a liquid discharge device using the ferroelectric film.

2. Description of the Related Art

Currently, the piezoelectric devices constituted by a piezoelectric body and electrodes are used, for example, as actuators installed in inkjet recording heads. In the piezoelectric devices, the piezoelectric body expands and contracts in correspondence with increase and decrease in the strength of an electric field applied from the electrodes to the piezoelectric body. The perovskite oxides such as PZT (lead titanate zirconate) are widely used as materials for the piezoelectric body. The perovskite oxides such as PZT are ferroelectric materials having spontaneous polarization (i.e., exhibiting polarization even when no electric field is applied).

Since the 1960s, it has been known that the PZTs doped with various donor ions having higher valences than the atoms substituted by the donor ions are superior to the intrinsic PZT in characteristics including the piezoelectric performance. Various lanthanide cations such as $Bi^{3+}$ and $La^{3+}$ ions are known as A-site donor ions with which the $Pb^{2+}$ ions in the A-sites can be substituted, and the ions of $V^{5+}$, $Nb^{5+}$, $Ta^{5+}$, $Sb^{5+}$, $Mo^{6+}$, $W^{6+}$, and the like are known as B-site donor ions with which the $Zr^{4+}$ and/or $Ti^{4+}$ ions in the B-sites can be substituted.

Formerly, the ferroelectric bodies were manufactured by mixing a plurality of types of oxide powder containing constituent elements of a desired material, and molding and baking the mixed powder; or by dispersing in an organic binder a plurality of types of oxide powder containing constituent elements of a desired material, applying to a substrate the organic binder in which the mixed powder is dispersed, and baking the substrate. That is, the ferroelectric bodies were manufactured through a baking process at the temperature of 600° C. or higher (normally at the temperature of 1000° C. or higher). Since the ferroelectric bodies were manufactured through a high-temperature thermal equilibrium state, high-concentration doping with a dopant (which has a valence essentially different from the valence of the material to be doped) is impossible.

S. Takahashi, "Effects of Impurity Doping in Lead Zirconate-Titanate Ceramics," Ferroelectrics, Vol. 41, pp. 143-156, 1982 reports results of studies on the doping of bulk ceramic PZT with various donor ions. FIG. 33 is a quote from "FIG. 14" in the Takahashi reference, and shows a relationship between the amount of the dopant and the dielectric constant. FIG. 33 shows that the performance is optimized when the amount of the dopant is approximately 1.0 mol % (which corresponds to approximately 0.5 weight percent in FIG. 33), and the performance deteriorates when the amount of the dopant exceeds the optimum amount.

Similarly, Japanese Unexamined Patent Publication No. 2003-055045 discloses that in the case where PZT is doped with niobium (Nb), antimony (Sb), or tungsten (W), the performance of the doped PZT increases until the amount of the dopant is increased to 3 mol %, and decreases when the amount of the dopant exceeds 3 mol %. In addition, Japanese Unexamined Patent Publication No. 2005-035843 discloses that the baking temperature can be lowered by doping PZT with vanadium (V), and the upper limit of the amount of the dopant is 0.4 weight percent. Further, U.S. Pat. No. 6,916,754 discloses that the baking temperature in liquid-phase sintering can be lowered by doping PZT with tungsten (W) and/or molybdenum (Mo), and the upper limit of the total amount of the dopant is 9.8 mol %. Furthermore, Japanese Unexamined Patent Publication No. 7 (1995)-330425 discloses that the variations in the performance can be suppressed by doping PZT with antimony (Sb), and the upper limit of the amount of the dopant is 3.0 weight percent.

As mentioned above, in the case where the ferroelectric bodies are manufactured by the conventional techniques, the upper limit of the amount of the B-site donor ions has been considered to be 9.8 mol %. In addition, when PZT is doped with the upper limit, 9.8 moi %, of the dopant for lowering the baking temperature, other characteristics are sacrificed for the doping.

Moreover, as indicated in T. Tanaka, et al., "Atsuden Ceramics Zairyo (Piezoelectric Ceramics Materials)," in Japanese, Gakkensha, Tokyo, pp. 110-131, 1973, it is known that the performance (of the relaxer ferroelectric materials) is improved by codoping with the donor ions having a higher valence and acceptor ions (such as $Ni^{2+}$ or $Co^{2+}$ ions) having a lower valence for balancing the valences. An example of such relaxer ferroelectric materials is PZT doped with $Pb(Ni_{1/3}Nb_{2/3})O_3$. In this example, PZT is codoped with the $Nb^{5+}$ ions and $Ni^{2+}$ ions, instead of being doped with the $Nb^{5+}$ ions only, so that the average valence of the B-site atoms in the thermal equilibrium state becomes +4. Therefore, doping of PZT with high-concentration niobium is enabled.

However, as indicated in the Takahashi reference, the doping with acceptor ions such as $Ni^{2+}$ or $Co^{2+}$ ions decreases the ferroelectric performance. Therefore, it is impossible to sufficiently realize the effect of the doping with the donor ions in the relaxer ferroelectric materials in which the doping with the acceptor ions is performed.

Japanese Unexamined Patent Publication No. 2005-072474, U.S. Pat. No. 7,187,025, Japanese Patent No. 3791614, Japanese Unexamined Patent Publications Nos. 2005-101512, 2006-182642, and 2006-188427, U.S. Pat. No. 7,196,457, and U.S. Patent Application Publication No.

20050236654, which are hereinafter collectively referred to as JP 2005-072474 to US 20050236654, disclose a ferroelectric film which is doped with 10 to 50 mol % of B-site donor ions such as V, Nb, or Ta ions, instead of being codoped with the acceptor ions.

All the ferroelectric films disclosed in JP 2005-072474 to US 20050236654 are formed by using the sol-gel technique. Since the sol-gel technique uses a thermal equilibrium process, when the ferroelectric films are produced in the manners disclosed in JP 2005-072474 to US 20050236654, it is necessary to add silicon (Si) as a sintering assistant in order to promote sintering and realize a thermal equilibrium state. In addition to Si, germanium (Ge) and tin (Sn) are known as a sintering assistant. However, since the doping with such a sintering assistant decreases the ferroelectric performance, when the ferroelectric films are produced in the manners disclosed in JP 2005-072474 to US 20050236654, it is impossible to sufficiently realize the effect of the doping with the donor ions.

The baking temperature can be relatively lowered by adding Si as a sintering assistant when the ferroelectric films are produced in the manners disclosed in JP 2005-072474 to US 20050236654. However, in this case, it is impossible to form ferroelectric films having a thickness greater than 1 micrometer, since cracks are likely to be produced when the thicknesses of the ferroelectric films are increased. Therefore, actually, the greatest thicknesses of the ferroelectric films disclosed in JP 2005-072474 to US 20050236654 are as small as approximately 0.2 micrometers. Such thin ferroelectric films can be used in ferroelectric memories. However, such thin ferroelectric films cannot achieve sufficient displacement in piezoelectric devices. It is preferable that the ferroelectric films in piezoelectric devices have a thickness of 3 micrometers or greater. Although the thickness of the ferroelectric films may be increased by repeating formation of a thin film, the repeated formation for increasing the thickness is impractical.

Further, as indicated in Japanese Unexamined Patent Publication No. 2005-150694, the Pb defect (loss of lead) is likely to occur when the sol-gel technique as disclosed in JP 2005-072474 to US 20050236654 is used. There is a tendency that the ferroelectric performance decreases when the Pb defect occurs. Therefore, use of the sol-gel technique as disclosed in JP 2005-072474 to US 20050236654 is not desirable.

SUMMARY OF THE INVENTION

The present invention has been made in view of the above circumstances.

The first object of the present invention is to provide a PZT-based ferroelectric film which is highly doped with B-site donor ions, exhibits superior ferroelectric performance, and can be formed with no A-site defect and increased thickness.

The second object of the present invention is to provide a process for producing a PZT-based ferroelectric film which is highly doped with B-site donor ions and exhibits superior ferroelectric performance, without doping with a sintering assistant or acceptor ions.

The third object of the present invention is to provide a piezoelectric device produced by using the ferroelectric film achieving the first object.

The fourth object of the present invention is to provide a liquid discharge device using the ferroelectric film achieving the first object.

(I) In order to accomplish the above first object, a ferroelectric film according to the first aspect of the present invention is provided. The ferroelectric film according to the first aspect of the present invention is characterized in having a columnar-grain structure constituted by a plurality of columnar grains, and containing as a main component a perovskite oxide which has a composition expressed by a compositional formula, $$A_{1+\delta}[(Zr_xTi_{1-x})_{1-y}M_y]O_z, \quad (P)$$

where A represents one or more A-site elements including lead (Pb) as a main component, M represents one or more of vanadium (V), niobium (Nb), tantalum (Ta), and antimony (Sb) as one or more B-site elements, zirconium (Zr) and titanium (Ti) are also B-site elements, $0<x\leq0.7$, $0.1\leq y\leq0.4$, $\delta$ is approximately (or theoretically) zero, z is approximately (or theoretically) 3, and $\delta$ and z may deviate from 0 and 3, respectively, within ranges of $\delta$ and z in which the composition expressed by the compositional formula $A_{1+\delta}[(Zr_xTi_{1-x})_{1-y}M_y]O_z$ can substantially form a perovskite structure.

In this specification, the term "main component" means a component the content of which is 80 weight percent or higher.

The ferroelectric film according to the first aspect of the present invention is a PZT-based ferroelectric film which can be doped with a high concentration (10 to 40 mol %) of B-site donor ions without being doped with a sintering assistant or acceptor ions. The high-concentration of B-site donor ions realizes superior ferroelectric (piezoelectric) performance. In addition, since the ferroelectric film according to the first aspect of the present invention is not doped with a sintering assistant or acceptor ions, it is possible to suppress the lowering of the ferroelectric (piezoelectric) performance, and thus maximize the ferroelectric (piezoelectric) performance enhanced by the doping with the donor ions.

The ferroelectric film according to the first aspect of the present invention can further have one or any possible combination of the following additional features (i) to (v).

(i) The composition of the ferroelectric film may contain substantially no silicon. That is, the ferroelectric film contains no silicon except for silicon included in inevitable impurities.

(ii) In the composition of the ferroelectric film, the composition of the one or more A-site elements can be increased so as to satisfy the inequalities $0<\delta\leq0.2$. That is, the ferroelectric film according to the first aspect of the present invention can be rich in the one or more A-site elements.

(iii) In the composition of the ferroelectric film, it is preferable that $0.2\leq y\leq0.4$.

(iv) A preferable example of the one or more A-site elements represented by A is bismuth (Bi).

(v) The ferroelectric film can have a thickness of 3.0 micrometers or greater.

(II) in order to accomplish the above second object, according to the second aspect of the present invention, a process for producing the ferroelectric film according to the first aspect of the present invention is provided. The process according to the second aspect of the present invention is characterized in that the ferroelectric film is formed by a non-thermal equilibrium process.

As mentioned before, in the thermal equilibrium process such as the sol-gel technique, high-concentration doping with a dopant which has a valence essentially different from the valence of the material to be doped is difficult. Therefore, some contrivance such as addition of a sintering assistant or acceptor ions is necessary to achieve high-concentration doping with donor ions. However, in this case, it is impossible to form ferroelectric films having a thickness greater than 1 micrometer, since cracks are likely to be produced when the thicknesses of the ferroelectric films are increased. On the other hand, the non-thermal equilibrium process enables high-concentration doping with donor ions without doping with a sintering assistant or acceptor ions. Therefore, the process according to the second aspect of the present invention enables production of a ferroelectric film having a great thickness.

In addition, the non-thermal equilibrium process enables film formation at relatively low temperature, which is lower than the temperature range in which reaction with Pb occurs. Therefore, the process according to the second aspect of the present invention enables production of a ferroelectric film without A-site defect, and a ferroelectric film which is rich in A-site elements.

Preferably, the process according to the second aspect of the present invention may further have one or any possible combination of the following additional features (vi) to (xiii).

(vi) The ferroelectric film may be formed by sputtering.

(vii) In the process according to the second aspect of the present invention having the feature (vi), it is preferable that the ferroelectric film be formed under a condition concurrently satisfying the inequalities, $$Ts \geq 400, \text{ and} \quad (1)$$

$$-0.2Ts+100 < Vs-Vf < -0.2Ts+130, \quad (2)$$

where Ts represents the film-formation temperature in degrees centigrade, Vs represents in volts a plasma potential in plasma generated during formation of the ferroelectric film, and Vf represents in volts a floating potential in the plasma generated during the formation of the ferroelectric film.

In this specification, the film-formation temperature is the temperature of the center of the substrate on which the ferroelectric film is formed.

(viii) In the process according to the second aspect of the present invention having the feature (vi), it is particularly preferable that the ferroelectric film be formed under a condition concurrently satisfying the inequalities, $$Ts \geq 400, \quad (1)$$

$$-0.2Ts+100 < Vs-Vf < -0.2Ts+130, \text{ and} \quad (2)$$

$$10 \leq Vs-Vf \leq 35, \quad (3)$$

where Ts represents the film-formation temperature in degrees centigrade, Vs represents in volts a plasma potential in plasma generated during formation of the ferroelectric film, and Vf represents in volts a floating potential in the plasma generated during the formation of the ferroelectric film.

In this specification, it is assumed that the plasma potential Vs and the floating potential Vf are measured by the single-probe technique using the Langmuir probe. In order to prevent inclusion of errors caused by adhesion of a portion of a film being formed or the like to the probe, the tip of the probe is maintained in the vicinity of the substrate (for example, approximately 10 mm from the substrate) in the measurement, and the measurement is completed in the shortest possible time. The potential difference Vs–Vf between the plasma potential Vs and the floating potential Vf, measured in volts (V), can be directly converted into an electron temperature expressed in electron volts (eV), where 1 eV corresponds to 11,600 K (Kelvin).

(ix) In the process according to the second aspect of the present invention having the feature (vi), the ferroelectric film can be formed on a substrate by sputtering in a sputtering system in which at least one target is arranged apart from the substrate, the at least one target has a composition corresponding to the composition of the ferroelectric film, the substrate is held at the temperature of 400° C. or higher, and a plurality of shield elements are arranged apart from the at least one target around a space located on the substrate side of the target in such a manner that the plurality of shield elements are vertically spaced from each other and have such a height that the difference between the floating potential and the plasma potential in plasma generated during formation of the ferroelectric film is equal to or greater than 35 V. At this time, it is preferable that the ferroelectric film be formed under a condition concurrently satisfying the inequalities (1) and (2), and it is particularly preferable that the ferroelectric film be formed under a condition concurrently satisfying the inequalities (1), (2), and (3). That is, it is possible to realize the condition concurrently satisfying the inequalities (1) and (2), and more preferably the inequalities (1), (2), and (3), by adjusting the height of the shield elements.

(x) In the process according to the second aspect of the present invention having the feature (vi), the ferroelectric film can be satisfactorily formed on a substrate by sputtering in an arrangement in which at least one target faces the substrate, under a condition that the inequalities, $$400 \leq Ts \leq 500, \text{ and} \quad (4)$$

$$30 \leq D \leq 80, \quad (5)$$

are concurrently satisfied, Ts represents the film-formation temperature in degrees centigrade, D represents in millimeters a distance between the substrate and the at least one target, and the at least one target has a composition corresponding to the composition of the ferroelectric film.

In this specification, the distance in millimeters between the substrate and the at least one target is defined as an average distance from the center of the surface of the substrate facing the at least one target side to the at least one target.

(xi) In the process according to the second aspect of the present invention having the feature (vi), the ferroelectric film can be satisfactorily formed on a substrate by sputtering which is performed in an arrangement in which at least one target faces the substrate, under a condition that the inequalities, $$500 \leq Ts \leq 600, \text{ and} \quad (6)$$

$$30 \leq D \leq 100, \quad (7)$$

are concurrently satisfied, Ts represents the film-formation temperature in degrees centigrade, D represents in millimeters a distance between the substrate and the at least one target, and the at least one target has a composition corresponding to the composition of the ferroelectric film.

(xii) In the process according to the second aspect of the present invention having the feature (vi), the ferroelectric film can be satisfactorily formed by sputtering under a condition that inequalities, $$400 \leq Ts \leq 475, \text{ and} \quad (8)$$

$$20 \leq Vs \leq 50, \quad (9)$$

are concurrently satisfied, Ts represents the film-formation temperature in degrees centigrade, and Vs represents in volts a plasma potential in plasma generated during formation of the ferroelectric film.

(xiii) In the process according to the second aspect of the present invention having the feature (vi), the ferroelectric film can be satisfactorily formed by sputtering under a condition that inequalities, $$475 \leq Ts \leq 600, \text{ and} \quad (10)$$

$$Vs \leq 40, \quad (11)$$

are concurrently satisfied, Ts represents the film-formation temperature in degrees centigrade, and Vs represents in volts a plasma potential in plasma generated during formation of the ferroelectric film.

(III) In order to accomplish the above third object, a ferroelectric device according to the third aspect of the present invention is provided. The ferroelectric device according to the third aspect of the present invention is characterized in comprising: the ferroelectric film according to the first aspect of the present invention; and electrodes for applying an electric field to the ferroelectric film.

(IV) In order to accomplish the above fourth object, a liquid discharge device according to the fourth aspect of the present invention is provided. The liquid discharge device according to the fourth aspect of the present invention comprises: the piezoelectric device according to the third aspect of the present invention; and a discharge member including a liquid-reserve chamber which reserves liquid, and a liquid-discharge outlet through which the liquid is externally discharged from the liquid-reserve chamber.

DESCRIPTION OF PREFERRED EMBODIMENTS

Figure 1A:
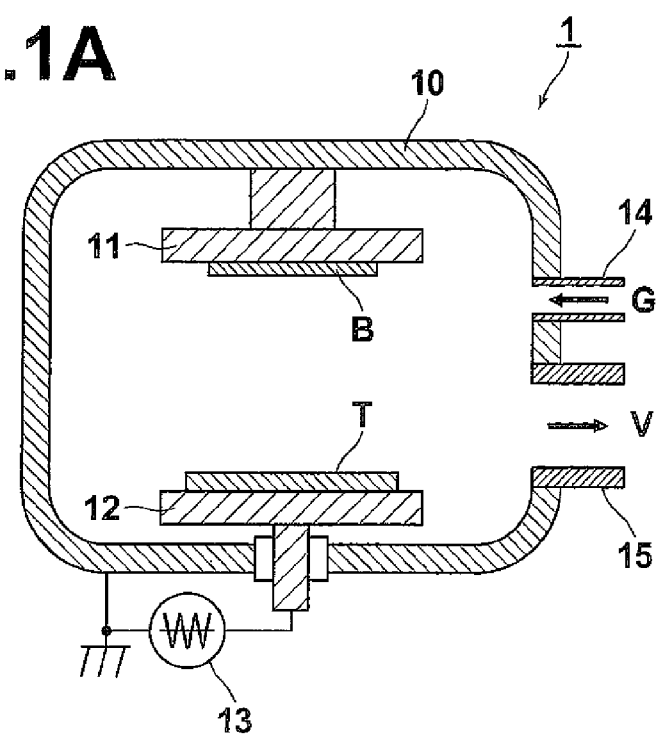
FIG. 1A is a cross-sectional view schematically illustrating a cross section of a sputtering system.

Preferred embodiments of the present invention are explained in detail below with reference to drawings.

1. ferroelectric film

The present inventors have found that when PZT-based ferroelectric films are formed by a non-thermal equilibrium process such as sputtering, PZT-based ferroelectric films can be doped with a high concentration (10 to 40 mol %) of B-site donor ions without being doped with a sintering assistant or acceptor ions, and the PZT-based ferroelectric films formed by a non-thermal equilibrium process have a columnar-grain structure constituted by a great number of columnar grains. Such a columnar-grain structure cannot be formed by the conventional sol-gel technique as disclosed in JP 2005-072474 to US 20050236654.

As explained in the "SUMMARY OF THE INVENTION," the ferroelectric film according to the first aspect of the present invention is characterized in having a columnar-grain structure constituted by a plurality of columnar grains, and containing as a main component a perovskite oxide which has a composition expressed by the compositional formula,

$$A_{1+\delta}[(Zr_xTi_{1-x})_{1-y}M_y]O_z, \quad (P)$$

where A represents one or more A-site elements including lead (Pb) as a main component, M represents one or more of vanadium (V), niobium (Nb), tantalum (Ta), and antimony (Sb) as one or more B-site elements, zirconium (Zr) and titanium (Ti) are also B-site elements, $0<x\leq0.7$, $0.1\leq y\leq0.4$, $\delta$ is approximately (or theoretically) zero, z is approximately (or theoretically) 3, and $\delta$ and z may deviate from 0 and 3, respectively, within ranges of $\delta$ and z in which the composition expressed by the compositional formula $A_{1+\delta}[(Zr_xTi_{1-x})_{1-y}M_y]O_z$ can substantially form a perovskite structure.

As explained in the "Description of the Related Art," the Tanaka reference and the like propose codoping with donor ions and acceptor ions such as $Ni^{2+}$ or $Co^{2+}$ ions in order to achieve high-concentration doping with the donor ions. On the other hand, according to the present invention, it is possible to produce a ferroelectric film which contains substantially no acceptor ions.

When ferroelectric films are formed in the manners disclosed in JP 2005-072474 to US 20050236654, it is necessary to add silicon (Si) as a sintering assistant. On the other hand, according to the present invention, it is possible to produce a ferroelectric film which contains substantially no silicon. Although germanium (Ge) and tin (Sn) are also known as sintering assistants, according to the present invention, it is also possible to produce a ferroelectric film which contains substantially neither germanium nor tin.

It is known that addition of a sintering assistant or acceptor ions lowers the ferroelectric performance. However, according to the present invention, it is unnecessary to add a sintering assistant or acceptor ions for forming a ferroelectric film, so that it is possible to suppress the lowering of the ferroelectric performance, and maximize the ferroelectric performance enhanced by the doping with the donor ions. However, it is possible to add some sintering assistant or acceptor ions to the ferroelectric films according to the present invention as far as the characteristics of the ferroelectric films are not affected.

Since the ferroelectric film according to the present invention has a columnar-grain structure constituted by a plurality of columnar grains extending nonparallel to the substrate surface, the ferroelectric film according to the present invention is an oriented film in which the orientations of crystals are aligned. Such a film structure can realize high piezoelectric performance, and is therefore advantageous.

The piezoelectric strains of ferroelectric films include the following types (1) to (4)

(1) Normal field-induced strain (i.e., expansion and contraction along a direction in which an electric field is applied) which is produced in response to increase and decrease in the strength of the electric field when the direction of the electric field coincides with the direction of a vector component of the spontaneous polarization axis;

(2) Piezoelectric strain which is produced by reversible rotation of a polarization axis by a rotation angle different from 180 degrees when increase and decrease in the strength of the electric field causes the reversible rotation;

(3) Piezoelectric strain which is produced by a volume change caused by phase transition of a crystal when increase and decrease in the strength of the electric field causes the phase transition; and (4) Piezoelectric strain which is produced by the engineered-domain effect when the ferroelectric film has an oriented crystal structure being formed of a material in which phase transition is caused by application of an electric field, and containing a ferroelectric phase which is oriented in a direction different from the spontaneous polarization. (The engineered-domain effect can increase the piezoelectric strain, and be utilized by applying an electric field to the ferroelectric film under a condition in which phase transition occurs, or within a range in which phase transition does not occur.)

It is possible to achieve a desired amount of piezoelectric strain by utilizing one or a combination of all or part of the above types (1) to (4). When a ferroelectric film has an oriented crystal structure suitable for one or more of mechanisms by which the above types of piezoelectric strain are produced, the amount of the produced piezoelectric strain becomes great. Therefore, in order to achieve high piezoelectric performance, it is preferable that the ferroelectric film have crystal orientation. For example, when the ferroelectric film is formed of a PZT-based ferroelectric material having an MPB (morphotropic phase boundary) composition, it is possible to produce a (100)-oriented film having a columnar-grain structure.

It is sufficient that the direction of growth of the columnar grains constituting the columnar-grain structure is nonparallel to the substrate surface, and the direction may be either perpendicular or oblique to the substrate surface.

The average diameter of the columnar grains constituting the columnar-grain structure is not specifically limited, and the preferable average diameter of the columnar grains constituting the ferroelectric film is 30 nanometers to 1 micrometer. When the average diameter of the columnar grains is too small, the crystal growth is insufficient for realizing desired ferroelectric (piezoelectric) performance. On the other hand, when the average diameter of the columnar grains is too great, the precision in patterned shapes deteriorates.

As mentioned before, when the sol-gel technique as disclosed in JP 2005-072474 to US 20050236654 is used, the Pb defect is likely to occurs, and there is a tendency that the ferroelectric performance decreases when the Pb defect occur. On the other hand, according to the present invention, it is possible to provide a ferroelectric film having the composition expressed by the compositional formula $A_{1+\delta}[(Zr_xTi_{1-x})_{1-y}M_y]O_z$, where $\delta \geq 0$. That is, according to the present invention, it is possible to provide a ferroelectric film without A-site defect, and a ferroelectric film which is rich in A-site elements. The present inventors have confirmed that a ferroelectric film which is rich in A-site elements in the range satisfying the inequalities $0<\delta \leq 0.2$ can be formed according to the present invention. Although a ferroelectric film which does not contain A-site defects (i.e., $\delta \geq 0$) can be formed according to the present invention, the ferroelectric film may contain some A-site defects as far as the characteristics of the ferroelectric film are not affected.

It is preferable that the composition of the ferroelectric film according to the present invention satisfy the inequalities $0.2 \leq y \leq 0.4$. The present inventors have found that the P-E (polarization-versus-electric field) characteristic of the ferroelectric film according to the present invention exhibits asymmetric hysteresis which is unbalanced toward the positive side when $y<0.2$, and the asymmetry decreases and the P-E characteristic approaches symmetric hysteresis when $0.2 \leq y$. When the absolute values of the coercive electric field Ec1 on the negative-electric-field side and the coercive electric field Ec2 on the positive-electric-field side are different ($|Ec1| \neq |Ec2|$), the P-E hysteresis is determined to be asymmetric.

The ferroelectric film can be used in ferroelectric devices, in which the ferroelectric film is sandwiched between an upper electrode and a lower electrode. The ferroelectric device is driven by applying an electric field to the ferroelectric film through the upper and lower electrodes. At this time, one of the upper and lower electrodes is used as a grand electrode fixed at 0 V, and the other of the upper and lower electrodes is used as an address electrode to which a driving voltage is applied. Normally, for ease of driving, the lower electrode is used as the grand electrode, and the upper electrode is used as the address electrode. Hereinafter, application of a positive driving voltage to the address electrode is referred to as application of a positive electric field to the ferroelectric film, and application of a negative driving voltage to the address electrode is referred to as application of a negative electric field to the ferroelectric film.

Ferroelectric films having asymmetric P-E hysteresis which is unbalanced toward the positive side are less easily polarized and less easily exhibit piezoelectric performance when a positive electric field is applied to the ferroelectric film, and are more easily polarized and more easily exhibit piezoelectric performance when a negative electric field is applied to the ferroelectric film. In order to apply the negative electric field, it is necessary to prepare a driver IC for applying a negative voltage to the upper electrode. However, since such a driver IC is not commercially available, it is necessary to newly produce a driver IC, so that the development cost increases. If the lower electrode can be patterned and used as the address electrode, and the upper electrode can be used as the grand electrode, the commercially available driver IC can be used. However, the manufacturing process for patterning the lower electrode is complex, and is therefore undesirable. On the other hand, the P-E hysteresis of the ferroelectric film with $0.2 \leq y \leq 0.4$ is nearly symmetric, and is therefore desirable from the viewpoint of actuation.

In the ferroelectric film according to the present invention, no specific limitation is imposed on the preferable A-site dopants in the perovskite oxide having the composition expressed by the compositional formula (P). For example, bismuth (Bi) and the like are preferable for the A-site dopants. The present inventors have found that when the ferroelectric film is doped with Bi as an A-site dopant, the asymmetry in the P-E hysteresis decreases and the P-E hysteresis approaches the symmetric hysteresis even in the range of $y<0.2$.

In addition, in the ferroelectric film according to the present invention, it is sufficient that the value x indicating the composition of Zr and Ti satisfies the inequalities $0<x \leq 0.7$. However, higher piezoelectric performance can be achieved when the composition of Zr and Ti is near to the MPB composition, which corresponds to the phase transition point between the tetragonal phase and the rhombohedral phase. Therefore, it is preferable that the composition x satisfy $0.45<x<0.7$, and it is more preferable that the composition x satisfy $0.47<x<0.57$.

Further, according to the present invention, it is possible to produce ferroelectric films containing as the main component a perovskite oxide which has the composition expressed by the compositional formula (P), and having a thickness of 3.0 micrometers or greater.

2. First Production Process of Ferroelectric Film

The ferroelectric film according to the present invention containing a perovskite oxide with the composition expressed by the compositional formula (P) can be formed by a non-thermal equilibrium process. Sputtering, plasma CVD (chemical vapor deposition), sintering with rapid quenching, anneal quenching, spray quenching, and the like are examples of techniques preferable for formation of the ferroelectric film according to the present invention. In particular, sputtering is preferable for formation of the ferroelectric film according to the present invention.

As mentioned before, in the thermal equilibrium process such as the sol-gel technique, high-concentration doping with a dopant which has a valence essentially different from the valence of the material to be doped is difficult. Therefore, some contrivance such as addition of a sintering assistant or acceptor ions is necessary to achieve high-concentration doping with donor ions. On the other hand, the non-thermal equilibrium process enables high-concentration doping with donor ions without doping with a sintering assistant or acceptor ions.

Since the non-thermal equilibrium process enables film formation at relatively low temperature, which is lower than the temperature range in which reaction with Si and Pb occurs, it is possible to form the ferroelectric film on a Si substrate, which can be easily processed. Consequently, use of the non-thermal equilibrium process is desirable.

The factors of sputtering which can affect the characteristics of a ferroelectric film to be formed are considered to include the film-formation temperature, the type of the substrate, the composition of a layer (if any) which is formed on the substrate before the ferroelectric film and underlies the ferroelectric film, the surface energy of the substrate, the film-formation pressure, the oxygen fraction in the atmosphere, the input power, the substrate-target distance, the electron temperature and the electron density in plasma, the density and the lifetime of active species in plasma, and the like.

The present inventors have investigated ones (among a number of factors in the film formation) which greatly affect the characteristics of the ferroelectric film formed by sputtering, and found a film-formation condition which enables formation of a satisfactory film, as disclosed in Japanese patent applications Nos. 2006-263978, 2006-263979, and 2006-263980.

Figure 19:
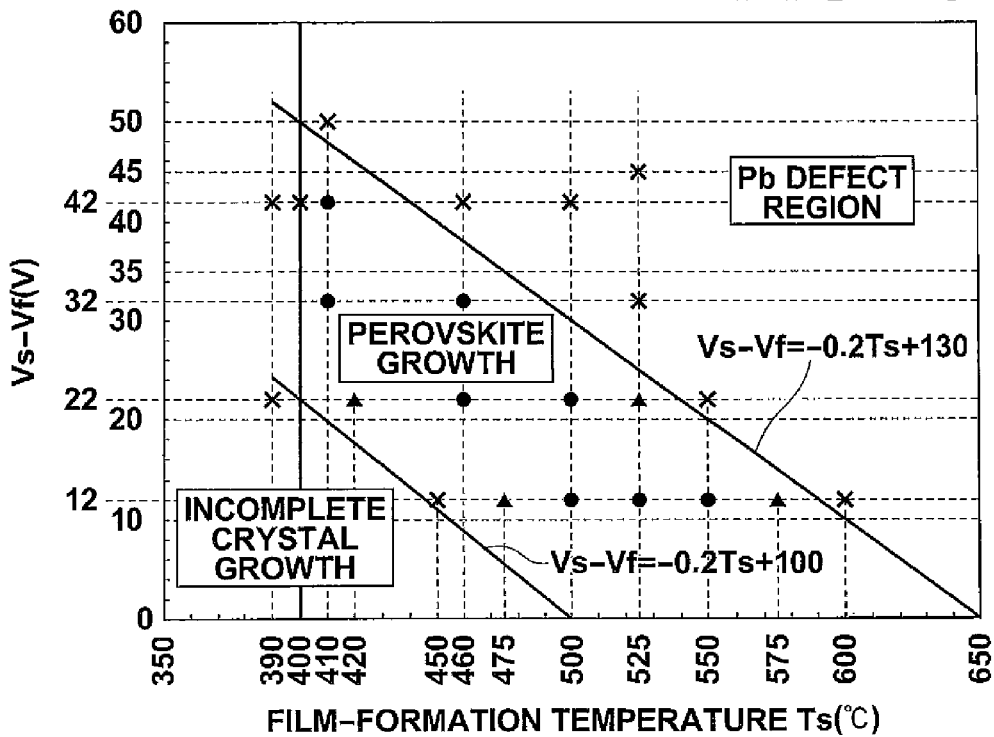
FIG. 19 is a diagram indicating relationships between the film-formation condition and the film characteristics of PZT-based ferroelectric films produced by non-thermal equilibrium processes in the experimental examples 4 to 6, where the abscissa corresponds to the film-formation temperature Ts, and the ordinate corresponds to the difference Vs–Vf.
Figure 25:
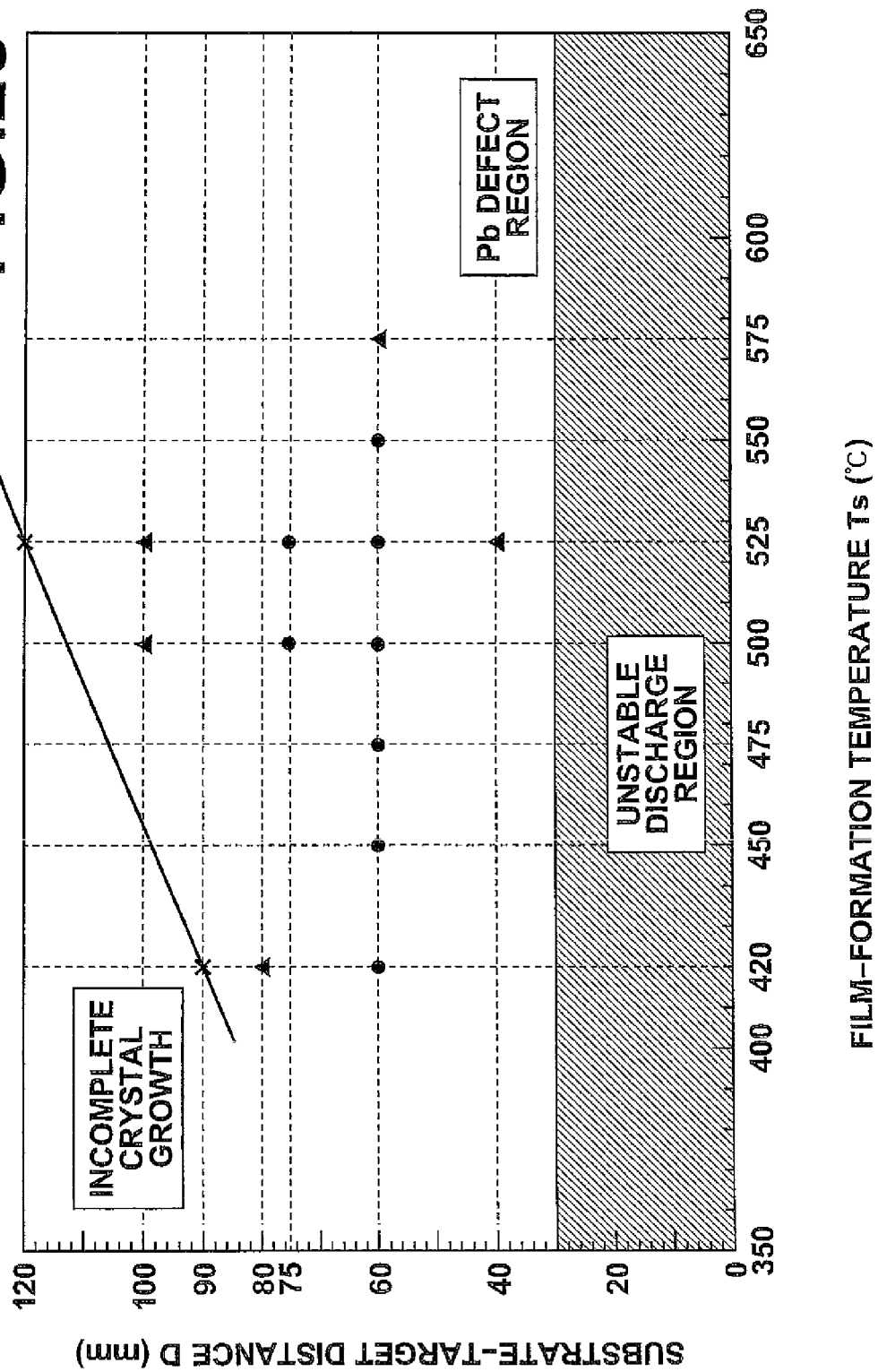
FIG. 25 is a diagram indicating relationships between the film-formation condition and the film characteristics of PZT-based ferroelectric films produced by non-thermal equilibrium processes in experimental examples including the experimental example 7 and an experimental example 8, where the abscissa corresponds to the film-formation temperature Ts, and the ordinate corresponds to the substrate-target distance D.
Figure 32:
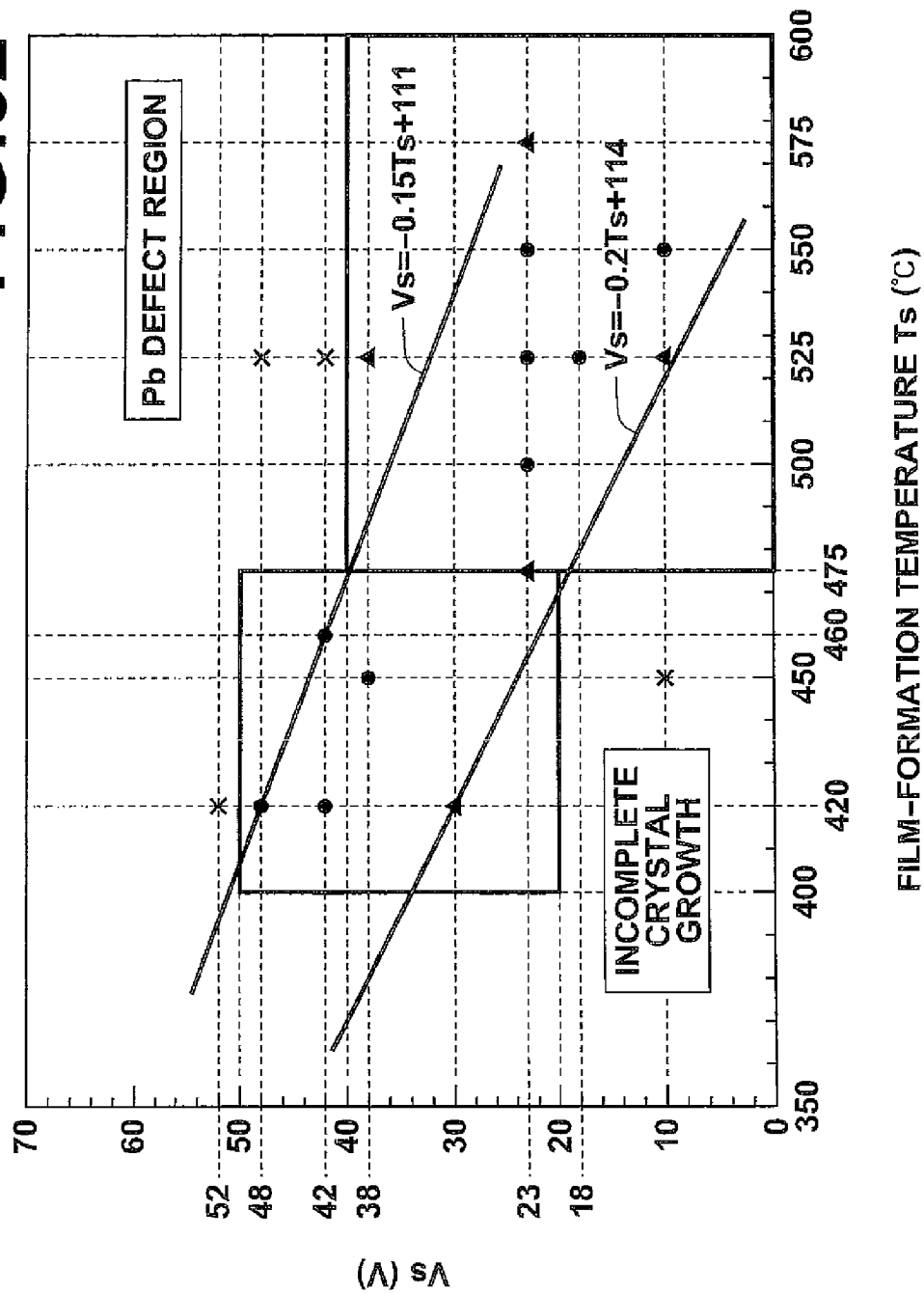
FIG. 32 is a diagram indicating relationships between the film-formation condition and the film characteristics of PZT-based ferroelectric films produced by non-thermal equilibrium processes in experimental examples including the experimental examples 9 and 10, where the abscissa corresponds to the film-formation temperature Ts, and the ordinate corresponds to the plasma potential Vs.
Figure 33:
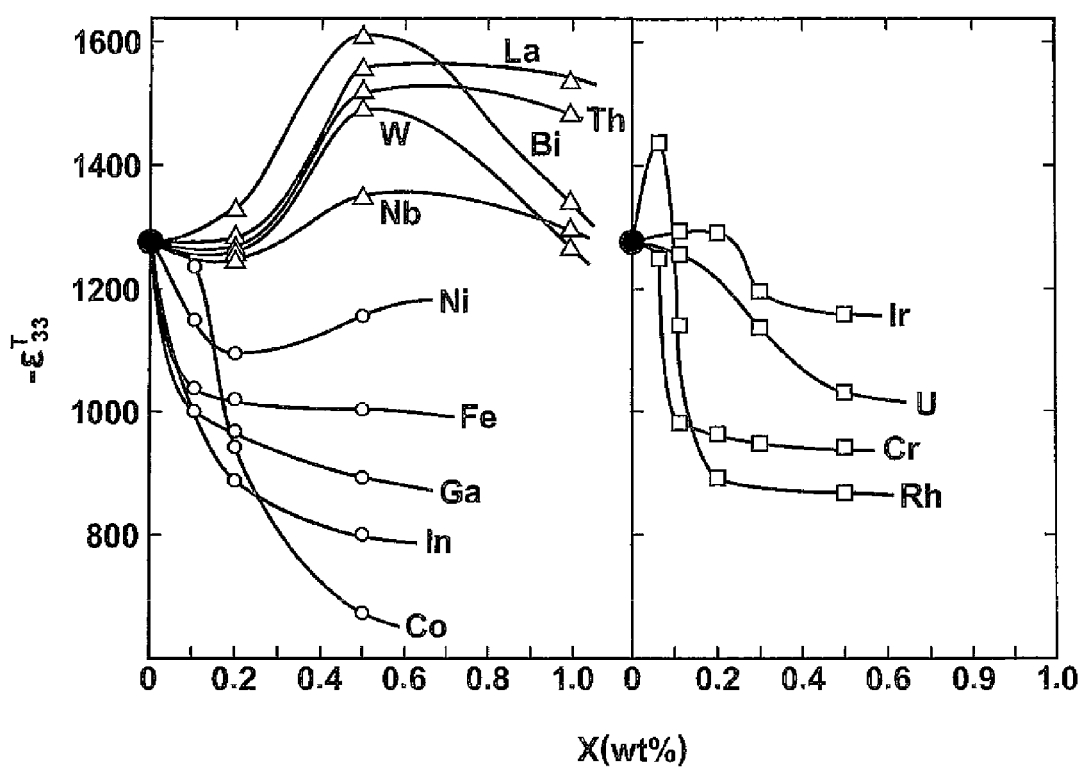
FIG. 33 is a quote from "FIG. 14" in the Takahashi reference, and shows a relationship between the amount of the dopant and the dielectric constant.

Specifically, the present inventors have found that satisfactory films can be formed by preferably setting the film-formation temperature Ts and one of the plasma potential Vs in plasma during film formation, the substrate-target distance D, and the difference Vs–Vf between the plasma potential Vs and the floating potential Vf. The present inventors have plotted the characteristic of the film with respect to the film-formation temperature Ts and each of the plasma potential Vs, the substrate-target distance D, and the difference Vs–Vf, as indicated in FIGS. 19, 25, and 32, and found that a satisfactory film can be formed in certain ranges of the film-formation temperature Ts and each of the plasma potential Vs, the substrate-target distance D, and the difference Vs–Vf. Tn FIGS. 19, 25, and 32, each of the filled circles indicates that perovskite crystals having satisfactory crystal orientation are stably formed under the condition indicated by the coordinate of the filled circle in the corresponding diagram; each of the filled triangles indicates that the film characteristics vary among samples formed under the identical condition indicated by the coordinate of the filled triangle in the corresponding diagram, and disorder of the orientation begins at the condition indicated by the coordinate in the corresponding diagram; and each of the crosses indicates that the films formed under the condition indicated by the coordinate of the cross in the corresponding diagram are mainly composed of the pyrochlore phase.

In the first production process according to the present invention (as the process according to the first embodiment of the present invention), ferroelectric films are formed by preferably setting the film-formation temperature Ts and the difference Vs–Vf between the plasma potential Vs and the floating potential Vf in plasma during film formation (in accordance with the procedure disclosed in Japanese patent application No. 2006-263978) as explained below.

First, an example of a sputtering system is explained with reference to FIG. 1A, which is a cross-sectional view schematically illustrating a cross section of a sputtering system. Although the example of the sputtering system explained below is an RF (radio frequency) sputtering system using an RF power supply, alternatively, a DC sputtering system using a DC power supply may be used.

As illustrated in FIG. 1A, the sputtering system 1 comprises a vacuum chamber 10. In the vacuum chamber 10, a substrate holder 11 and a plasma electrode (cathode) 12 are arranged. The substrate holder 11 can hold a film-formation substrate B (on which a film is to be formed), and enables heating of the film-formation substrate B to a predetermined temperature. For example, the substrate holder 11 may be realized by an electrostatic chuck. The plasma electrode 12 generates plasma.

The substrate holder 11 and the plasma electrode 12 are arranged apart so as to face each other. The plasma electrode 12 is arranged so that a target T can be mounted on the plasma electrode 12. An RF power supply 13 is connected to the plasma electrode 12. In addition, a gas introduction tube 14 and a gas outlet tube 15 are connected to the vacuum chamber 10. The gas introduction tube 14 is provided for introducing gas G into the vacuum chamber 10, where the gas G is used for formation of the ferroelectric film. The gas exhaust tube 15 is provided for exhausting gas V from the vacuum chamber 10. The gas G introduced into the vacuum chamber 10 is Ar, a gas mixture of Ar and $O_2$, or the like.

Figure 1B:
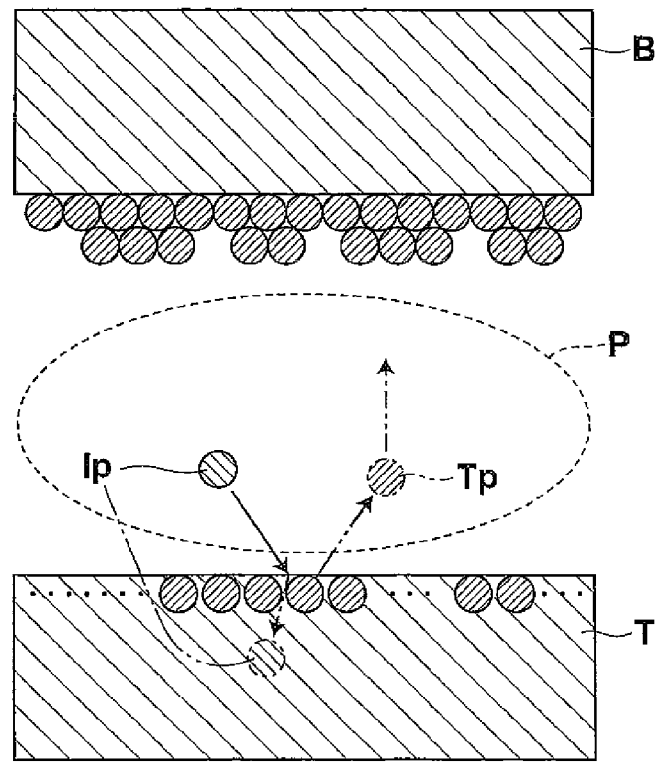
FIG. 1B is a cross-sectional view schematically illustrating formation of a ferroelectric film in the sputtering system.

FIG. 1B is a cross-sectional view schematically illustrating formation of a ferroelectric film in the sputtering system 1. As illustrated in FIG. 1B, discharge from the plasma electrode 12 turns the gas G into plasma so that positive ions Ip such as Ar ions are produced. The positive ions Ip bombard the target T, so that the atoms Tp constituting the target T are sputtered from the target T and deposited on the substrate B. At this time, the sputtered atoms Tp may be neutral or ionized. When the deposition of the sputtered atoms Tp on the substrate B is continued for a predetermined time, a film with a predetermined thickness is formed. In FIG. 1B, the plasma space is denoted by the reference P.

In the case where the ferroelectric film according to the present invention is formed by sputtering, it is preferable that the ferroelectric film be formed under a condition concurrently satisfying the inequalities (1) and (2), and it is more preferable that the ferroelectric film be formed under a condition concurrently satisfying the inequalities (1), (2), and (3). (See also the experimental examples 4 to 6 and FIG. 19.)

$$Ts \geq 400 \tag{1}$$

$$-0.2Ts+100 < Vs-Vf < -0.2Ts+130 \tag{2}$$

$$10 \leq Vs-Vf \leq 35 \tag{3}$$

In the inequalities (1), (2), and (3), Ts represents the film-formation temperature in degrees centigrade, Vs represents in volts the plasma potential in plasma generated during formation of the ferroelectric film, and Vf represents in volts the floating potential in the plasma generated during the formation of the ferroelectric film.

The potential of the plasma space P is the plasma potential Vs. Normally, the substrate B is made of an insulating material, and is electrically insulated from the ground (earth). Therefore, the substrate B is in a floating state, and the potential of the substrate B is the floating potential Vf. It is considered that the atoms Tp which have been sputtered from the target T and moved from the target T to the substrate B gain kinetic energy corresponding to the difference Vs–Vf in the potential between the plasma space P and the substrate B before the sputtered atoms Tp impinge the substrate B on which the film is being formed.

Figure 2:
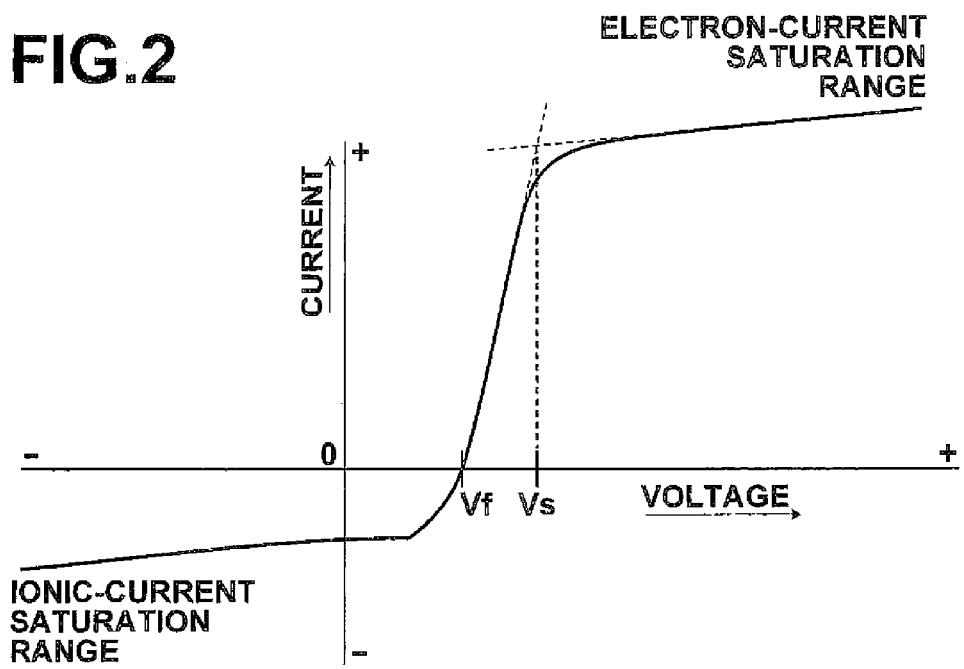
FIG. 2 is a diagram provided for explaining a manner of determining (measuring) the plasma potential Vs and the floating potential Vf.

The plasma potential Vs and the floating potential Vf can be measured by using the Langmuir probe. The tip of the Langmuir probe is inserted into the plasma space P, and the voltage applied to the probe is varied. At this time, a voltage-current characteristic as indicated in FIG. 2 is obtained. (See, for example, M. Konuma, "Basics of Plasma and Film Formation," in Japanese, Nikkan Kogyo Shinbunsha, Tokyo, p. 90, 1986.) In FIG. 2, the probe potential corresponding to the zero current is the floating potential Vt. At this point, the ion current and the electron current which flow into the probe surface are balanced. The floating potential Vf corresponds to the potential of the surface of the substrate and the surface of isolated metal. When the probe potential is raised above the floating potential Vf, the ion current gradually decreases. Then, when the probe potential becomes the plasma potential Vs, only the electron current reaches the probe.

The difference Vs−Vf between the floating potential Vf and the plasma potential Vs can be changed, for example, by arranging a ground (earth) between the substrate and the target. As mentioned before, the difference Vs−Vf corresponds to the kinetic energy of the atoms Tp which impinge the substrate B after being sputtered from the target T. Generally, the kinetic energy E can be expressed as a function of the temperature T as indicated by the equations, $$E=mv^2/2=3kT/2,$$

where m is the mass, v is the velocity, k is the Boltzmann constant, and T is the absolute temperature. Therefore, the difference Vs−Vf can be considered to have an effect similar to the temperature. In addition, the difference Vs−Vf can also be considered to have the effect of promoting surface migration, the effect of etching weakly coupled regions, and the like.

The present inventors have found that when the PZT-based ferroelectric film is formed under a condition that Ts<400 (i.e., the aforementioned inequality (1) is not satisfied), the perovskite crystal cannot sufficiently grow due to the low film-formation temperature, and a film mainly composed of the pyrochlore phase is formed, as indicated in FIG. 19.

The present inventors have found that when a PZT-based ferroelectric film is formed under a condition satisfying the inequality (1) (i.e., under the condition that the film-formation temperature satisfies the inequality Ts≧400° C.), perovskite crystals containing the pyrochlore phase at most in very small portions can stably grow under the additional condition satisfying the aforementioned inequalities (2) (i.e., under the additional condition that the difference Vs−Vf satisfies the inequalities −0.2Ts+100<Vs−Vf<−0.2Ts+130). The present inventors have confirmed that when the inequalities (1) and (2) are concurrently satisfied, it is possible to stably suppress the Pb defect, and stably grow a high-quality ferroelectric film having satisfactory crystal structure and composition, as indicated in FIG. 19.

It is known that the Pb defect is likely to occur when PZT-based ferroelectric films are formed by sputtering at high temperature. The present inventors have found that occurrence of the Ph defect depends on the difference Vs−Vf as well as the film-formation temperature Ts. Lead (Pb) exhibits the highest sputtering yield (i.e., Pb is most readily sputtered) among the constituent elements Pb, Zr, and Ti of PZT. For example, the table 8.1.7 in "Vacuum Handbook," edited by ULVAC Inc. and published by Ohmsha in Japanese in 2002 indicates that the sputtering yields of Pb, Zr, and Ti are respectively 0.75, 0.48, and 0.65 when the Ar ion energy is 300 eV. When atoms constituting the target are ready to be sputtered, the atoms are also ready to be resputtered after the sputtered atoms are deposited on the surface of the substrate. It is possible to consider that when the difference Vs−Vf between the plasma potential Vs and the floating potential Vf (i.e., the potential of the substrate) increases, the possibility of resputtering increases and the Pb defect becomes more likely to occur.

There is a tendency that perovskite crystals cannot satisfactorily grow when PZT-based ferroelectric films are formed under a condition in which the film-formation temperature Ts is too low and the difference Vs−Vf is too small, and the Pb defect is likely to occur when PZT-based ferroelectric films are formed under a condition in which the film-formation temperature Ts is too high or the difference Vs−Vf is too great.

Therefore, in the case where PZT-based ferroelectric films are formed under a condition satisfying the aforementioned inequality (1) (Ts≧400° C.), the difference Vs−Vf is required to be relatively great for satisfactory growth of perovskite crystals when the film-formation temperature Ts is relatively low, and is required to be relatively small for suppression of the Pb defect when the film-formation temperature Ts is relatively high. The aforementioned inequalities (2) specify the above requirement.

The present inventors have confirmed that ferroelectric films exhibiting a high piezoelectric constant can be obtained when the ferroelectric films are formed under a condition concurrently satisfying the aforementioned inequalities (1), (2), and (3).

The present inventors have found that when ferroelectric films are grown under an exemplary condition that the film-formation temperature Ts is approximately 420° C. and the difference Vs−Vf is approximately 42 V, perovskite crystals can grow without the Pb defect. However, the values of the piezoelectric constant $d_{31}$ of the ferroelectric films formed under the above condition are as low as approximately 100 pm/V. It is considered that since the difference Vs−Vf is too high, the kinetic energy of the atoms Tp which impinge the substrate after being sputtered from the target T is too high, and defects are likely to occur in the ferroelectric films, so that the piezoelectric constant is lowered. The present inventors have confirmed that when ferroelectric films are formed under a condition concurrently satisfying the aforementioned inequalities (1), (2), and (3), the values of the piezoelectric constant $d_{31}$ of the ferroelectric films are equal to or greater than 130 pm/V.

3. Preferable Sputtering System

Although the sputtering system is not specifically limited as far as the potential of the plasma space can be adjusted to satisfy the aforementioned conditions according to the present invention, it is possible to adjust the potential of the plasma space in a simple manner when the sputtering system disclosed in Japanese patent application No. 2006-263981 is used. In this sputtering system, a shield is arranged around the space located on the substrate side of the target held by the substrate holder so that the existence of the shield enables adjustment of the potential of the plasma space.

Figure 3:
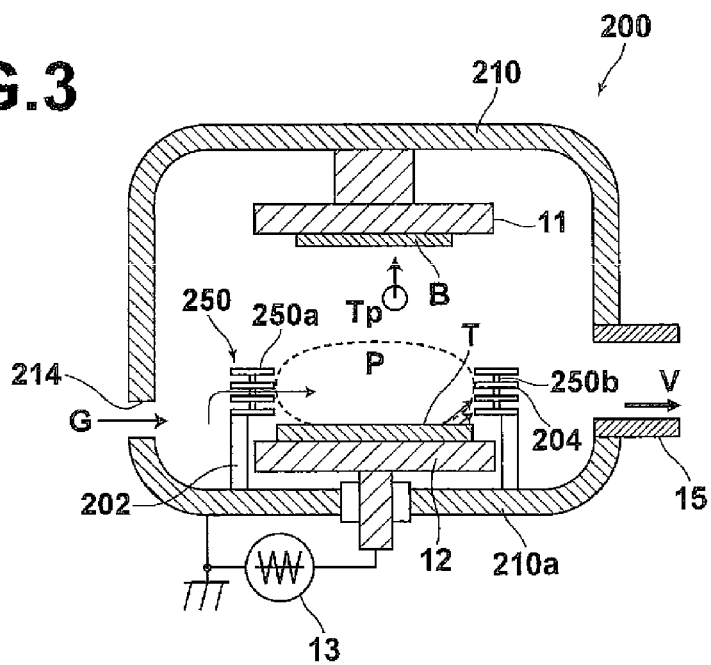
FIG. 3 is a cross-sectional view schematically illustrating a cross section of a sputtering system having a shield.

Hereinbelow, an example of the sputtering system as disclosed in Japanese patent application No. 2006-263981 and a manner of film formation in the sputtering system are explained with reference to FIGS. 3 and 1B. The sputtering system explained below is an RF (radio-frequency) sputtering system using an RF power supply (high-frequency power supply), although alternatively, it is possible to use a DC sputtering system using a DC power supply. FIG. 3 is a cross-sectional view schematically illustrating a cross section of a sputtering system having the shield.

As illustrated in FIG. 3, the sputtering system 200 comprises a vacuum chamber 210. In the vacuum chamber 210, a substrate holder 11 and a plasma electrode (cathode) 12 are arranged. The substrate holder 11 can hold a substrate B (on which a film is to be formed), and enables heating of the substrate B to a predetermined level of temperature. For example, the substrate holder 11 may be realized by an electrostatic chuck. The plasma electrode 12 generates plasma.

The substrate holder 11 and the plasma electrode 12 are arranged apart so as to face each other. The plasma electrode 12 is arranged so that a target T can be mounted on the plasma electrode 12. The target T has the composition corresponding to the composition of the film to be formed. The plasma electrode 12 is connected to an RF power supply 13. The plasma electrode 12 and the RF power supply 13 constitute a plasma generation unit. A shield 250 is arranged around a space located on the substrate side of the target T or on the substrate side of the plasma electrode 12 (as the target holder).

In addition, a gas introduction tube 214 and a gas outlet tube 215 are connected to the vacuum chamber 210. The gas introduction tube 214 is provided for introducing gas G into the vacuum chamber 210, where the gas (film-formation gas) G is used for formation of the ferroelectric film. The gas exhaust tube 215 is provided for exhausting gas (exhaust gas) V from the vacuum chamber 210. The gas introduction tube 214 is arranged opposite to the gas outlet tube 215 at an approximately identical elevation to the gas exhaust tube 215.

The gas G introduced into the vacuum chamber 210 is Ar, a gas mixture of Ar and $O_2$, or the like. As illustrated in FIG. 1B, discharge caused by the plasma electrode 12 turns the gas G into plasma so that positive ions Ip such as Ar ions are produced. The positive ions Ip bombard the target T, so that the atoms Tp constituting the target T are sputtered from the target T and deposited on the substrate B. At this time, the sputtered atoms Tp may be either neutral or ionized.

Further, the sputtering system 200 is characterized in that the shield 250 is arranged around the space located on the substrate side of the target T in the vacuum chamber 210. Specifically, the shield 250 is arranged on an earth shield 202 as a grounding member. The earth shield 202 is arranged on the bottom surface 210a of the vacuum chamber 210 so as to stand around the plasma electrode 12. The earth shield 202 is provided for preventing lateral or downward discharge from the plasma electrode 12 to the vacuum chamber 210.

Figure 4:
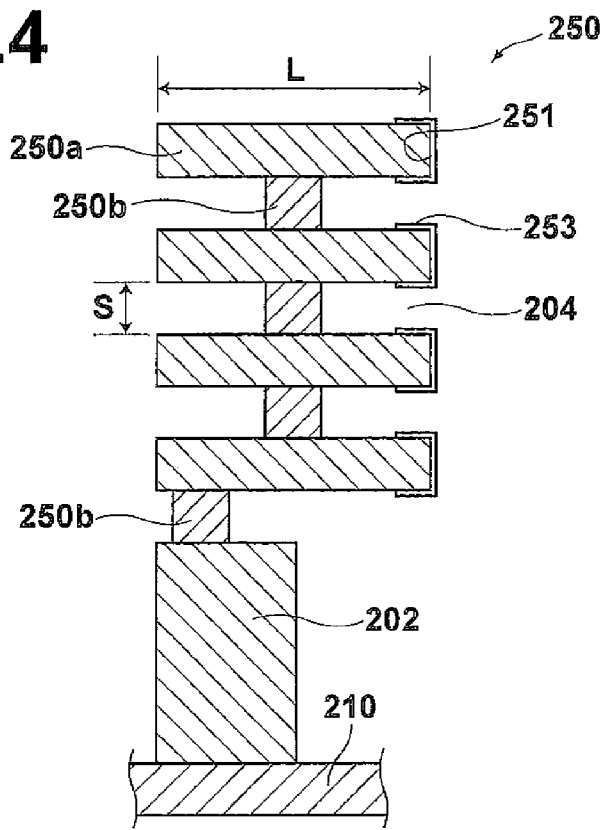
FIG. 4 is a magnified cross-sectional view schematically illustrating a partial radial cross section of the sputtering system of FIG. 3 including the shield and other constituents located around the shield.

For example, the shield 250 is constituted by a plurality of annular metal plates (rings or fins) 250a as illustrated in FIG. 4, which is a magnified cross-sectional view schematically illustrating a partial radial cross section of the sputtering system of FIG. 3 including the shield and other constituents located around the shield. In the example of FIG. 4, the number of the annular metal plates 250a is four. The annular metal plates 250a are spaced in the vertical direction, so that gaps 204 exist between the annular metal plates 250a and the gas G can easily flow through the gaps 204. A plurality of conductive spacers 250b are arranged in each gap between the annular metal plates 250a in such a manner that the plurality of conductive spacers 250b are spaced in the circumferential direction. In addition, in order to provide further paths of the gas G between the lowermost one of the annular metal plates 250a and the top surface of the earth shield 202, it is preferable that a plurality of conductive spacers 250b also be arranged between the lowermost one of the annular metal plates 250a and the top surface of the earth shield 202 in a similar manner.

The shield 250 is grounded through the electrical connection with the earth shield 202 and the vacuum chamber 210. Although the materials of which the annular metal plates 250a and the conductive spacers 250b are made are not specifically limited, the annular metal plates 250a and the conductive spacers 250b are preferably made of stainless steel.

Further, although not shown, the annular metal plates 250a may be electrically connected with additional conductive members which connect the annular metal plates 250a at the outer edges of the annular metal plates 250a. The provision of the additional conductive members enhances the effect of grounding of the annular metal plates 250a.

Since the shield 250 is arranged around the space located on the substrate side of the target T in the vacuum chamber 210, and grounded, the ground potential is realized around the space located on the substrate side of the target T.

In the sputtering system 200, it is possible to preferably adjust and set the condition of the plasma by using the shield 250. Specifically, the difference Vs–Vf between the plasma potential Vs and the floating potential Vf can be preferably adjusted as explained below.

When an RF voltage generated by the RF power supply 13 is applied to the plasma electrode 12 for forming a film on the substrate B, plasma is generated above the target T. At this time, discharge also occurs between the target T and the shield 250. It is considered that this discharge enables confinement of the plasma in the space surrounded by the shield 250, so that the plasma potential Vs is lowered and the difference Vs–Vf decreases. The decrease in the difference Vs–Vf results in decrease in the kinetic energy of the atoms Tp which impinge the substrate B after being sputtered from the target T. That is, it is possible to preferably control the kinetic energy of the atoms Tp impinging the substrate B after being sputtered from the target T, by preferably adjusting the difference Vs–Vf so as to form a satisfactory film.

There is a tendency that the difference Vs–Vf decreases with increase in the number of the annular metal plates 250a and the height of the shield. The present inventors consider that the reason for the tendency is that when the height of the shield increases, the discharge between the target T and the shield 250 increases and the difference Vs–Vf decreases.

It is possible to determine an optimum value of the difference Vs–Vf for a specific value of the film-formation temperature. In addition, it is also possible to realize the optimum potential difference by adjusting the number of the annular metal plates 250a without changing the film-formation temperature. Since the annular metal plates 250a are simply stacked through the conductive spacers 250b, it is possible to change the number of the annular metal plates 250a by removing or additionally stacking an annular metal plate.

The lowermost one of the annular metal plates 250a is apart from the outer edge of the target T. If the distance (along a straight line) from the outer edge of the target T to the lowermost one of the annular metal plates 250a is zero, discharge occurs. On the other hand, if the lowermost one of the annular metal plates 250a is too far from the outer edge of the target T, the shielding effect is reduced. The distance (along a straight line) from the outer edge of the target T to the lowermost one of the annular metal plates 250a is preferably 1 to 30 mm.

The atoms Tp sputtered from the target T can also be deposited on the annular metal plates 250a as well as the target T, since the annular metal plates 250a are located around the target T. The atoms Tp are mostly deposited on the inner edges of and the vicinities of the inner edges of the annular metal plates 250a. Specifically, as illustrated in FIG. 4, particles of the atoms Tp are deposited and films 253 are formed on the inner edge surfaces and the portions, near the inner edges, of the upper and lower surfaces of the annular metal plates 250a. If the atoms Tp sputtered from the target T are deposited and films are formed on the entire surfaces of the annular metal plates 250a, the function of the annular metal plates 250a as the ground (earth) is lost. Therefore, it is preferable that the shield 250 be arranged to be as resistant as possible to deposition of the particles of the atoms Tp.

Since the shield 250 in the sputtering system 200 is constituted by the plurality of annular metal plates 250a spaced in the vertical direction with the gaps 204, it is possible to prevent deposition of the atoms Tp sputtered from the target T on the entire surfaces of the shield 250 and change in the potential of the shield 250. Therefore, even when film formation is repeated, the function of the shield 250 is stable and effective, so that the difference Vs–Vf is stably maintained.

In particular, it is desirable that the width L of the annular metal plates 250a in the radial direction and the amount S of the gap 204 between the annular metal plates 250a satisfy the inequality L≧S, i.e., the width of the annular metal plates 250a is at least equal to the amount S of the gap 204. In this case, the sputtered atoms Tp are less likely to deposit on the entire surfaces of the annular metal plates 250a. That is, since the depths from the inner edges of the annular metal plates 250a are increased, the sputtered atoms Tp are less likely to move through the gaps 204 to the vicinities of the outer edges of the annular metal plates 250a, so that it is possible to prevent loss of the function of the shield 250 in a short time.

Further, it is possible to expect another effect of the gaps 204. Since the gaps 204 serve as paths of the film-formation gas G, the film-formation gas G can easily reach the portion of the plasma space in the vicinities of the target T through the gaps 204, and the gas ions produced by the plasma generation in the vicinity of the target T can easily reach the target T, so that the atoms Tp constituting the target T can be effectively sputtered. Thus, it is possible to consider that a satisfactory film having desirable characteristics can be stably formed.

Even in the case where the shield 250 has the gaps 204, the annular metal plates 250a can form an equipotential wall on the inner edge side as a gapless shield forms, the effect of the shield 250 (with the gaps 204) in controlling the difference Vs−Vf is equivalent to the effect of the gapless shield.

The difference Vs−Vf in the sputtering system 200 can be controlled by adjusting the height of the shield 250. The difference Vs−Vt can also be controlled by changing the input power supplied to the target T, the film-formation pressure, and the like. However, in the case where the difference Vs−Vf is controlled by changing the input power supplied to the target T, the film-formation pressure, and the like, sometimes, other parameters such as the film-formation rate also vary, so that desirable quality of the film cannot be achieved. The present inventors have performed an experiment of film formation under a certain condition, and found that when the input power supplied to the target T is decreased from 700 W to 300 W, the film-formation rate decreases from 4 mm/h to 2 mm/h although the difference Vs−Vf can be decreased from 38 V to 25 V. In the case where the sputtering system 200 is used, the difference Vs−Vf can be adjusted without changing other parameters such as the film-formation rate, so that it is easy to preferably set the film-formation condition, and a satisfactory film can be stably formed.

As explained above, since the ferroelectric film according to the present invention containing a perovskite oxide can be formed by a non-thermal equilibrium process, the ferroelectric film can be formed at relatively low temperature, which is lower than the temperature range in which reaction with Si and Pb occurs. Therefore, according to the present invention, it is possible to form a ferroelectric film which is doped with A-site substitution ions in a concentration higher than 1 mol % and B-site substitution ions in a concentration of 10 mol % or higher and exhibits superior ferroelectric performance, on a Si substrate without using a sintering assistant.

4. Second Production Process of Ferroelectric Film

In the second production process according to the present invention (as the process according to the second embodiment of the present invention), ferroelectric films are formed by using the sputtering system similar to the system illustrated in FIGS. 1A and 1B, and preferably setting the film-formation temperature Ts and the substrate-target distance D. (i.e., the distance D between the substrate B and the target T) (in accordance with the procedure disclosed in Japanese patent application No. 2006-263979) as explained below.

In the second production process according to the present invention, it is preferable that the ferroelectric film be formed under a condition concurrently satisfying the inequalities, $$400 \leq Ts \leq 500, \text{ and} \quad (4)$$

$$30 \leq D \leq 80, \quad (5)$$

where Ts represents the film-formation temperature in degrees centigrade, and D represents in millimeters a distance between the substrate and the at least one target.

In the second production process according to the present invention, it is also preferable that the ferroelectric film be formed under a condition that the inequalities, $$500 \leq Ts \leq 600, \text{ and} \quad (6)$$

$$30 \leq D \leq 100, \quad (7)$$

are concurrently satisfied.

The present inventors have found that when the PZT-based ferroelectric film is formed under a condition that Ts<400 (i.e., under a condition that the inequalities (4) is not satisfied), the perovskite crystal cannot sufficiently grow due to the low film-formation temperature, and a film mainly composed of the pyrochlore phase is formed.

The present inventors have also found that when the PZT-based ferroelectric film is formed under a condition that 400° C.≦Ts≦500° C. (i.e., under a condition that the inequalities (4) are satisfied), perovskite crystals containing the pyrochlore phase at most in very small portions can stably grow under an additional condition that 30≦D (mm)≦80 (i.e., under a condition that the inequalities (5) are satisfied). The present inventors have further found that when the PZT-based ferroelectric film is formed under a condition that 500° C.≦Ts≦600° C. (i.e., under a condition that the inequalities (6) are satisfied), perovskite crystals containing the pyrochlore phase at most in very small portions can stably grow under an additional condition that 30≦D (mm)≦100 (i.e., under a condition that the inequalities (7) are satisfied). The present inventors have confirmed that when the inequalities (4) and (5), or the inequalities (6) and (7) are concurrently satisfied, it is possible to stably suppress the Pb defect, and stably grow a high-quality piezoelectric film having satisfactory crystal structure and composition. (See the experimental examples 7 and 8 and FIG. 25.)

In the second production process according to the present invention, there is a tendency that perovskite crystals cannot satisfactorily grow when the film-formation temperature is too low and the substrate-target distance D is too great. In addition, there is another tendency that lead is likely to be lost when the film-formation temperature is too low and the substrate-target distance D is too small. Therefore, in the case where PZT-based ferroelectric films are formed under a condition satisfying the aforementioned inequalities (4) (400° C.≦Ts≦500° C.), the substrate-target distance D is required to be relatively small for satisfactorily growing perovskite crystals when the film-formation temperature Ts is relatively low, and is required to be relatively great for suppressing occurrence of the Pb defect when the film-formation temperature Ts is relatively high. The aforementioned inequalities (5) specify the above requirement. Similarly, the aforementioned inequalities (7) specify the above requirement for the case where PZT-based ferroelectric films are formed under a condition satisfying the aforementioned inequalities (6) (500° C.≦Ts≦600° C.), although the upper limit of the range of the substrate-target distance D specified by the inequalities (7) is greater than the upper limit specified by the inequalities (5) since the film-formation temperatures Ts specified by the inequalities (6) are higher than the film-formation temperatures Ts specified by the inequalities (4).

Figure 5:
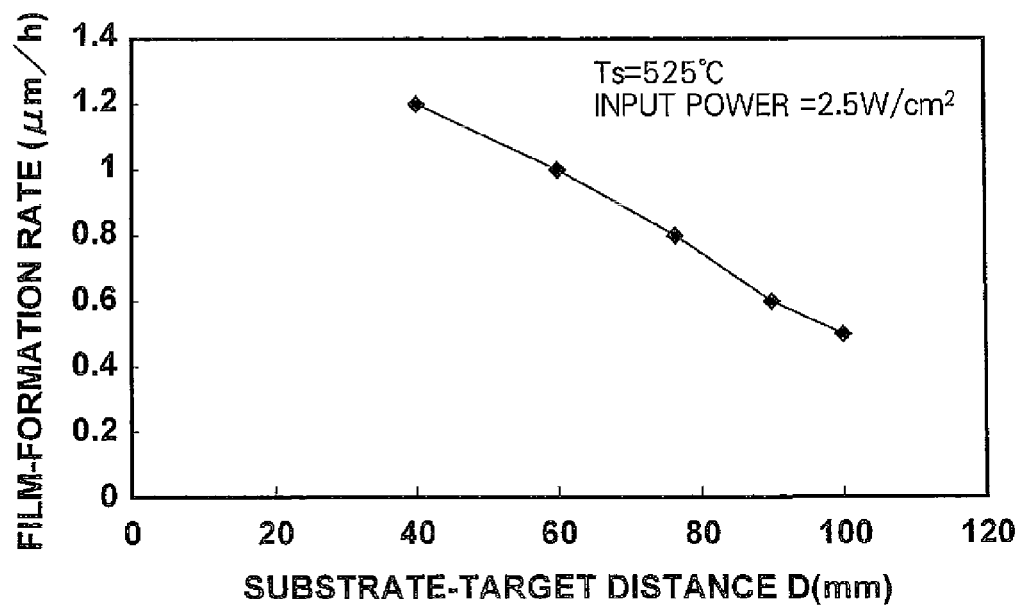
FIG. 5 is a diagram indicating a relationship between the substrate-target distance and the film-formation rate in a process for producing a ferroelectric film according to a second embodiment of the present invention.

From the viewpoint of the manufacturing efficiency, a higher film-formation rate is more preferable. Specifically, the film-formation rate is preferably 0.5 mm/h, and more preferably 1.0 mm/h. As illustrated in FIG. 5, the film-formation rate increases with decrease in the substrate-target distance D. FIG. 5 is a diagram indicating a relationship between the substrate-target distance D and the film-formation rate in the process for producing a PZT film according to the second embodiment of the present invention. In FIG. 5, the film-formation temperature Ts is 525° C., and the input power (RF power) supplied to the target T is 2.5 W/cm². According to the present invention, it is possible to form a film having satisfactory quality even under a high-speed film-formation condition that the film-formation rate is 1.0 mm/h or higher. The film-formation rate can become lower than 0.5 mm/h according to the substrate-target distance D. In such a case, it is desirable to adjust the input power supplied to the target T, and the like so as to increase the film-formation rate to 0.5 mm/h or higher.

It is preferable that the substrate-target distance D be smaller from the viewpoint of the film-formation rate. Preferably, the substrate-target distance D is 80 mm or smaller in the case where the film-formation temperature Ts is in the range of 400° C. to 500° C., and 100 mm or smaller in the case where the film-formation temperature Ts is in the range of 500° C. to 600° C. When the substrate-target distance D is smaller than 30 mm, the plasmic state becomes unstable, so that films having satisfactory quality may not be formed. In order to stably form piezoelectric films having higher quality, it is preferable that the substrate-target distance D be in the range of 50 to 70 mm in either of the range of 400° C. to 500° C. and the range of 500° C. to 600° C.

The present inventors have confirmed that when the film-formation condition satisfies the inequalities (4) and (5) or the inequalities (6) and (7), it is possible to stably form high-quality piezoelectric films having satisfactory quality at high manufacturing efficiency (i.e., at high film-formation rate).

As explained above, the second production process according to the present invention also uses a non-thermal equilibrium process (by which the ferroelectric films containing a perovskite oxide can be formed), and therefore has similar advantages to the first production process according to the present invention.

5. Third Production Process of Ferroelectric Film

In the third production process according to the present invention (as the process according to the third embodiment of the present invention), ferroelectric films are formed by using the sputtering system similar to the system illustrated in FIGS. 1A and 1B, and preferably setting the film-formation temperature Ts and the plasma potential Vs in plasma during film formation (in accordance with the procedure disclosed in Japanese patent application No. 2006-263980) as explained below.

In the third production process according to the present invention, it is preferable that the ferroelectric film be formed under a condition concurrently satisfying the inequalities, $$400 \leq Ts \leq 475, \text{ and} \quad (8)$$

$$20 \leq Vs \leq 50, \quad (9)$$

where Ts represents the film-formation temperature in degrees centigrade, and Vs represents in volts a plasma potential in plasma generated during formation of the ferroelectric film.

In the third production process according to the present invention, it is also preferable that the ferroelectric film be formed under a condition that the inequalities, $$475 \leq Ts \leq 600, \text{ and} \quad (10)$$

$$Vs \leq 40, \quad (11)$$

are concurrently satisfied.

The plasma potential Vs can be changed, for example, by arranging a ground (earth) between the substrate B and the target T. Similar to the difference Vs−Vf, the plasma potential Vs can also be considered to have the effect of promoting surface migration, the effect of etching weakly coupled regions, and the like.

The present inventors have found that when piezoelectric films containing a perovskite oxide with the composition expressed by the compositional formula (P) is formed under a condition that 400° C.≤Ts≤475° C. (i.e., under a condition that the inequalities (8) are satisfied), perovskite crystals containing the pyrochlore phase at most in very small portions can stably grow under an additional condition that 20≤Vs≤50 (i.e., under a condition that the inequalities (9) are satisfied). The present inventors have further found that when piezoelectric films containing a perovskite oxide with the composition expressed by the compositional formula (P) is formed under a condition that 475° C.≤Ts≤600° C. (i.e., under a condition that the inequalities (10) are satisfied), perovskite crystals containing the pyrochlore phase at most in very small portions can stably grow under an additional condition that Vs≤40 (i.e., under a condition that the inequality (11) is satisfied). In addition, the present inventors have also confirmed that when the inequalities (8) and (9), or the inequalities (10) and (11) are concurrently satisfied, it is possible to stably suppress the Pb defect.

Further, the present inventors have found that in order to stably form piezoelectric films having more satisfactory crystal structure and composition, it is preferable to determine the film-formation condition so as to satisfy the inequalities, $$420 \leq Ts \leq 575, \text{ and} \quad (12)$$

$$-0.15Ts+111 < Vs < -0.2Ts+114. \quad (13)$$

where Ts represents the film-formation temperature in degrees centigrade, and Vs represents in volts a plasma potential in plasma generated during formation of the ferroelectric film.

Furthermore, the present inventors have found that in order to stably form piezoelectric films having more satisfactory crystal structure and composition, it is particularly preferable to determine the film-formation condition so as to satisfy the inequalities (14) and (15) or the inequalities (16) and (17) indicated below. (See the experimental examples 9 and 10 and FIG. 32.)

$$420 \leq Ts \leq 460 \quad (14)$$

$$30 \leq Vs \leq 48 \quad (15)$$

$$475 \leq Ts \leq 575 \quad (16)$$

$$10 \leq Vs \leq 38 \quad (17)$$

In the inequalities (14), (15), (16), and (17), Ts represents the film-formation temperature in degrees centigrade, and Vs represents in volts a plasma potential in plasma generated during formation of the ferroelectric film.

In the third production process according to the present invention, there is a tendency that perovskite crystals cannot satisfactorily grow when both of the film-formation temperature and the plasma potential Vs are too low. In addition, there is another tendency that lead is likely to be lost when either of the film-formation temperature and the plasma potential Vs is too great.

Although the substrate-target distance D is not specifically limited in the third production process according to the present invention, the substrate-target distance D is preferably 30 to 80 mm. Since the film-formation rate increases with decrease in the substrate-target distance D, the decrease in the substrate-target distance D increases efficiency. However, when the substrate-target distance D is too small, the plasmic state becomes unstable, so that formation of a satisfactory film is difficult.

The present inventors have confirmed that when a piezoelectric film of a perovskite oxide expressed by the compositional formula (P) is formed under a condition concurrently satisfying the inequalities (8) and (18), or the inequalities (10) and (19) indicated below, the dielectric constant $d_{31}$ of the piezoelectric film becomes high.

$$400 \leq Ts \leq 475 \quad (8)$$

$$35 \leq Vs \leq 45 \quad (18)$$

$$475 \leq Ts \leq 600 \quad (10)$$

$$10 \leq Vs \leq 35 \quad (19)$$

The present inventors have confirmed that when a piezoelectric film of a perovskite oxide expressed by the compositional formula (P) is formed at the film-formation temperature Ts of approximately 420° C. and the plasma potential Vs is approximately 48 V, perovskite crystals can grow without the Pb defect. However, the piezoelectric constant $d_{31}$ of the piezoelectric film formed under the above conditions that Ts=420° C. and Vs=48 V has been found to be as low as approximately 100 pm/V. It is possible to consider that the kinetic energy of the atoms Tp impinging the substrate is too high under the conditions that Ts=420° C. and Vs=48 V, so that defects are likely to be produced in the films, and the dielectric constant decreases. The present inventors have confirmed that when piezoelectric films are formed under the condition concurrently satisfying the inequalities (8) and (18), or the inequalities (10) and (19), the values of the piezoelectric constant $d_{31}$ of the piezoelectric films can be 130 pm/V or higher.

As explained above, the third production process according to the present invention also uses a non-thermal equilibrium process (by which the ferroelectric films containing a perovskite oxide can be formed), and therefore has similar advantages to the first production process according to the present invention.

6. Piezoelectric Device and Inkjet Recording Head

Figure 6:
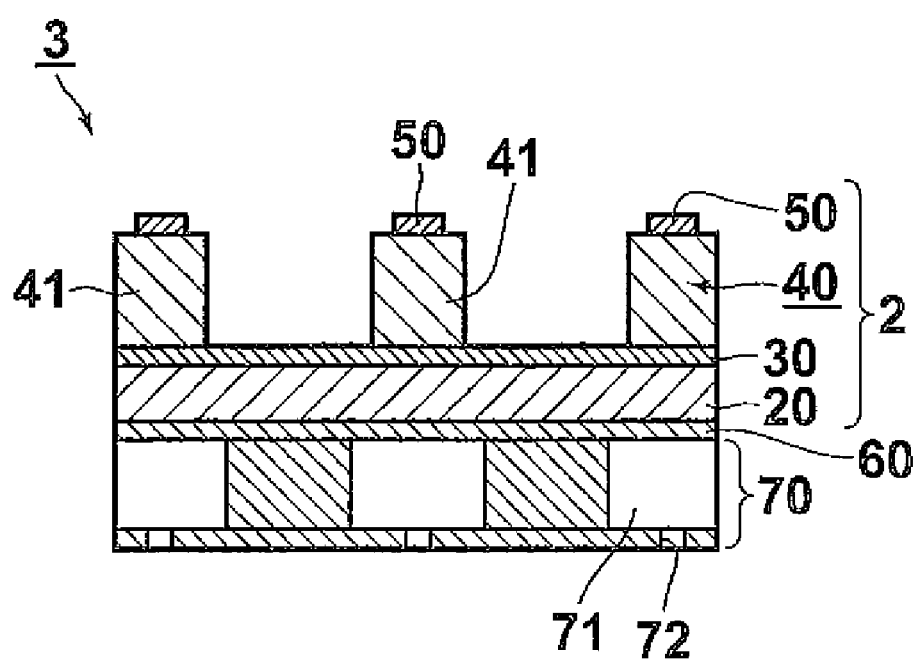
FIG. 6 is a cross-sectional view schematically illustrating a cross section of an essential portion of an inkjet recording head (as a liquid discharge device) having a piezoelectric device (ferroelectric device) according to an embodiment of the present invention.

Hereinbelow, the structure of an inkjet recording head (as an embodiment of the liquid discharge device according to the fourth aspect of the present invention) containing a piezoelectric device (as an embodiment of the ferroelectric device according to the third aspect of the present invention) is explained with reference to FIG. 6, which is a cross-sectional view schematically illustrating a cross section of an essential portion of the inkjet recording head. In FIG. 6, the dimensions of the illustrated elements are differentiated from the actual dimensions of the elements of the inkjet recording head for clarification.

In outline, the inkjet recording head 3 illustrated in FIG. 6 is constituted by a piezoelectric device 2, a diaphragm 60, and an ink-nozzle member 70.

The piezoelectric device 2 is produced by forming on a substrate 20 a lower electrode 30, a ferroelectric (piezoelectric) film 40, and upper electrodes 50 in this order so that an electric field in the thickness direction can be applied to each portion (corresponding to a pixel or an ink chamber) of the ferroelectric film 40 through the lower electrode 30 and the upper electrodes 50. The ferroelectric film 40 is a ferroelectric film according to the present invention containing the perovskite oxide having the composition expressed by the compositional formula (P).

The lower electrode 30 is formed over approximately the entire (upper) surface of the substrate 20. The ferroelectric film 40 formed on the lower electrode 30 is patterned into protruding portions 41 in a stripelike arrangement, where each of the protruding portions 41 has a linear shape and extends in the direction perpendicular to the plane of FIG. 6. The upper electrodes 50 are respectively formed on the protruding portions 41. However, the pattern of the ferroelectric film 40 is not limited to the above arrangement, and other patterns may be used according to necessity. Although the ferroelectric film 40 may be a continuous (solid) ferroelectric film, it is preferable to pattern the ferroelectric film 40 into the separate protruding portions 41 since the separate protruding portions can smoothly expand and contract, and achieve great displacement.

The material (composition) of the substrate 20 is not specifically limited. For example, the substrate 20 may be made of silicon, glass, stainless steel, YSZ (yttrium stabilized zirconia), alumina, sapphire, silicon carbide, or the like. In addition, the substrate 20 may be realized by a laminated substrate such as the SOI (silicon-on-insulator) substrate, which is produced by alternately forming on a surface of a silicon substrate one or more oxide films of $SiO_2$ and one or more Si active layers.

The main component of the lower electrode 30 is not specifically limited, and may be, for example, one or a combination of metals such as Au, Pt, and Ir, metal oxides such as $IrO_2$, $RuO_2$, $LaNiO_3$, and $SrRuO_3$.

The main component of the upper electrodes 50 is not specifically limited, and may be, for example, one or a combination of metals such as Au, Pt, and Ir, metal oxides such as $IrO_2$, $RuO_2$, $LaNiO_3$, and $SrRuO_3$, and the materials which are generally used for electrodes in the semiconductor processes, such as Al, Ta, Cr, and Cu.

Although the thicknesses of the lower electrode 30 and the upper electrodes 50 are not specifically limited, the thicknesses of the lower electrode 30 and the upper electrodes 50 are, for example, approximately 200 nm. Although the thickness of the ferroelectric film 40 (i.e., the height of the protruding portions 41) is not specifically limited, the thickness of the ferroelectric film 40 is normally 1 micrometer or greater, and is, for example, 1 to 5 micrometers. It is preferable that the thickness of the ferroelectric film 40 be 3 micrometers or greater.

In outline, the inkjet recording head 3 is produced by attaching the diaphragm 60 to the back surface of the substrate 20 of the piezoelectric device 2, and attaching the ink-nozzle member 70 to the diaphragm 60. The ink-nozzle member 70 comprises ink chambers 71 (as the liquid-reserve chambers) and ink-discharge outlets 72 (as the liquid-discharge outlets). Each of the ink chambers 71 is connected to the corresponding one of the ink chambers 71. Each of the ink chambers 71 reserves the ink, and the ink held in the ink chamber is discharged out of the ink chamber through the corresponding ink-discharge outlet. The ink chambers 71 are arranged in correspondence with the protruding portions 41 of the ferroelectric film 40.

Alternatively, it is possible to process portions of the substrate 20 into the diaphragm 60 and the ink-nozzle member 70, instead of separately preparing the diaphragm 60 and the ink-nozzle member 70 and attaching the diaphragm 60 and the ink-nozzle member 70 to the piezoelectric device 2. For example, in the case where the substrate 20 is formed by a laminated substrate such as the SOI substrate, the ink chambers 71 can be formed by etching the corresponding portions of the substrate 20 from the bottom surface of the substrate 20, and the diaphragm 60 and the structures of the ink-nozzle member 70 can be produced by processing the substrate 20 per se.

In the above inkjet recording head 3, the strength of the electric field applied to each portion (corresponding to a pixel or an ink chamber) of the piezoelectric device 2 is increased or decreased so as to expand or contract each portion of the piezoelectric device 2 and control the discharge of the ink from the corresponding one of the ink chambers 71 and the discharge amount of the ink.

7. Inkjet Recording Apparatus

Figure 7:
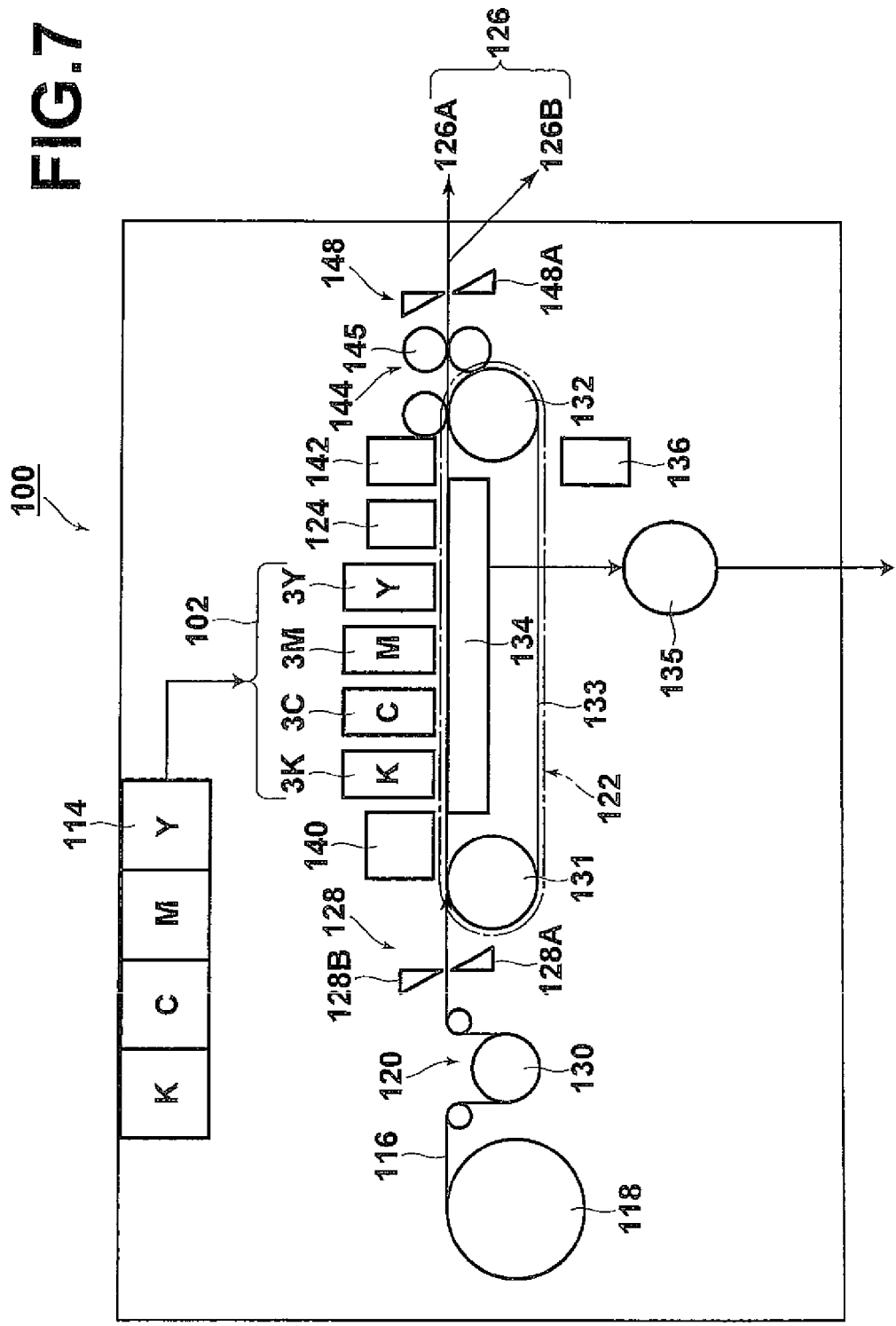
FIG. 7 is a schematic diagram of an example of an inkjet recording apparatus using the inkjet recording head of FIG. 6.
Figure 8:
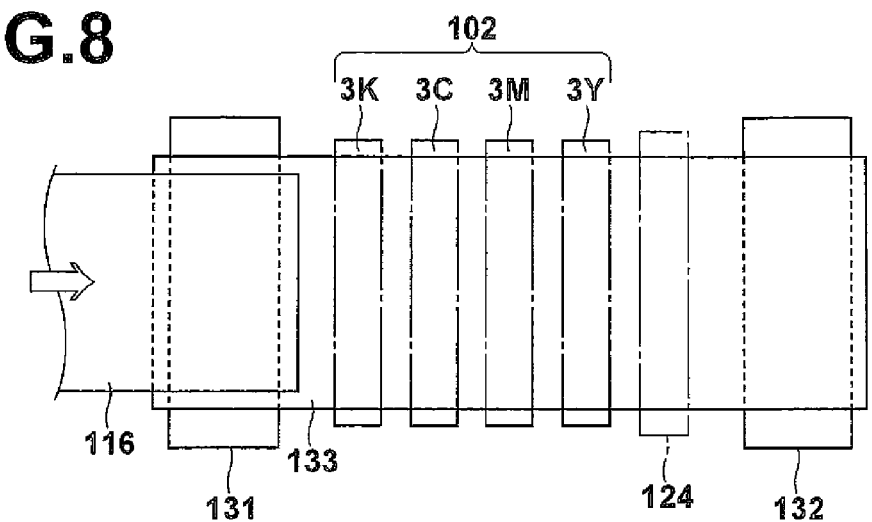
FIG. 8 is a top view of a portion of the inkjet recording apparatus of FIG. 7.

Hereinbelow, an example of an inkjet recording apparatus having the inkjet recording head 3 is explained with reference to FIGS. 7 and 8. FIG. 7 is a schematic diagram illustrating an outline of an example of an inkjet recording apparatus having the inkjet recording head 3 of FIG. 6, and FIG. 8 is a top view of a portion of the inkjet recording apparatus of FIG. 7.

As schematically illustrated in FIG. 7, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head according to the present embodiment as explained before. In order to realize a linear head (explained later), each inkjet recording head used in the inkjet recording apparatus 100 comprises a plurality of ink chambers and a plurality of ink-discharge outlets.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120 as illustrated in FIG. 7. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 7, and the recording sheet 116 held on the endless belt 133 is moved from left to right in FIG. 7.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 8. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 8. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 having a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

8. EVALUATION OF EXPERIMENTAL EXAMPLES

The present inventors have performed a number of experiments of on the compositions of ferroelectric films and the conditions for producing ferroelectric films, and examples of the experiments are indicated below.

8.1 Experimental Example 1

8.1.1 Production of Experimental Example 1

In the experimental example 1, first and second samples of ferroelectric films have been produced as follows.

First, substrates having an electrode have been produced by forming on 25 mm square substrates of silicon (Si) an adhesion layer of titanium (Ti) having a thickness of 30 nm and a lower electrode of iridium (Ir) having a thickness of 300 nm in this order.

Next, a plurality of different types of Nb-doped PZT-based ferroelectric films, as first samples in the experimental example 1, have been respectively formed on the above substrates in the atmosphere of a mixture of Ar and 2.5 volume percent $O_2$ at the pressure of 0.5 Pa by using an RF sputtering system and a plurality of different targets having different compositions. The plurality of different types of Nb-doped PZT-based ferroelectric films are PZT-based ferroelectric films respectively doped with different amounts of niobium (Nb). The film-formation temperature Ta is 525° C., and the thicknesses of the ferroelectric films are 4 micrometers. During the film formation, each substrate has been held in a floating state at a distance of 60 mm from the target, and a ground (earth) has been arranged apart from the substrate outside the space between the substrate and the target. The plasma potential Vs and the floating potential Vf have been measured, and the difference Vs−Vf has been obtained as approximately 12 V. At this time, the floating potential Vf is the potential in the vicinity of the substrate, (specifically, the potential at the distance of approximately 10 mm from the substrate in this example). Hereinafter, the Nb-doped PZT-based ferroelectric material is referred to as Nb-PZT.

Thereafter, an upper electrode of platinum (Pt) having a thickness of 100 nm has been formed on each of the plurality of Nb-PZT ferroelectric film by sputtering. Thus, production of a plurality of ferroelectric device respectively containing the plurality of different types of Nb-doped PZT-based ferroelectric films (as the first samples in the experimental example 1) has been completed.

In the experimental example 1, a plurality of second samples of ferroelectric films have also been produced in a similar manner to the plurality of first samples of ferroelectric films in the experimental example 1. The second samples in the experimental example 1 are a plurality of different types of Ta-doped PZT-based ferroelectric films, which are PZT-based ferroelectric films respectively doped with different amounts of tantalum (Ta). Hereinafter, the Ta-doped PZT-based ferroelectric material is referred to as Ta-PZT.

8.1.2 EDX Measurement

The compositions of the ferroelectric films as the first and second samples in the experimental example 1 have been analyzed by EDX (energy-dispersive X-ray spectrometry).

The ferroelectric film in every sample in the experimental example 1 has been found to have a composition expressed as

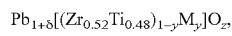

$$Pb_{1+\delta}[(Zr_{0.52}Ti_{0.48})_{1-y}M_y]O_z,$$

where M represents niobium (Nb) or tantalum (Ta). The compositions y of the Nb-PZT film in the first samples have been found to be respectively 0.12, 0.15, 0.18, and 0.25, and the compositions y of the Ta-PZT film in the second samples have been found to be 0.02 to 0.20. In every ferroelectric film, $1+\delta$ have been found to be 1.02 to 1.10. That is, every ferroelectric film in the first and second samples has been found to be rich in lead. Since the intensity of the observed oxygen K-line peak in every ferroelectric film has been found to be weak, the composition z of oxygen has not been able to be determined, although the composition z of oxygen has been roughly estimated to be in the range, $2 < z \leq 3$.

8.1.3 SEM Observation of Cross Section

The cross sections of the ferroelectric films as the first and second samples in the experimental example 1 have been observed by SEM (Scanning Electron Microscope), and it has been confirmed that every ferroelectric film in the experimental example 1 is a film having a columnar-grain structure constituted by a great number of columnar grains which extend approximately perpendicular to the surface of the substrate and have the average diameter of approximately 150 nm.

8.1.4 XRD Analysis

The crystal structures of the ferroelectric films as the first and second samples in the experimental example 1 have been analyzed by XRD (X-ray diffraction).

Each of the Nb-PZT ferroelectric films doped with 12 to 18 mol % Nb in the first samples has been found to be a (100)-oriented perovskite-structure film, and (100), (110), and (111) peaks have been observed in the Nb-PZT ferroelectric film doped with 25 mol % Nb. In addition, every Ta-PZT ferroelectric film in the second samples has also been found to be a (100)-oriented perovskite-structure film.

8.1.5 P-E Hysteresis Measurement

The P-E (polarization-versus-electric field) hystereses of the ferroelectric films as the first and second samples in the experimental example 1 have been measured, and the magnitude of polarization ($\mu C/cm^2$) at the electric field E=100 kV/cm (at which the polarization is almost saturated) has been obtained as the magnitude of the maximum polarization Pmax ($\mu C/m^2$).

Figure 9:
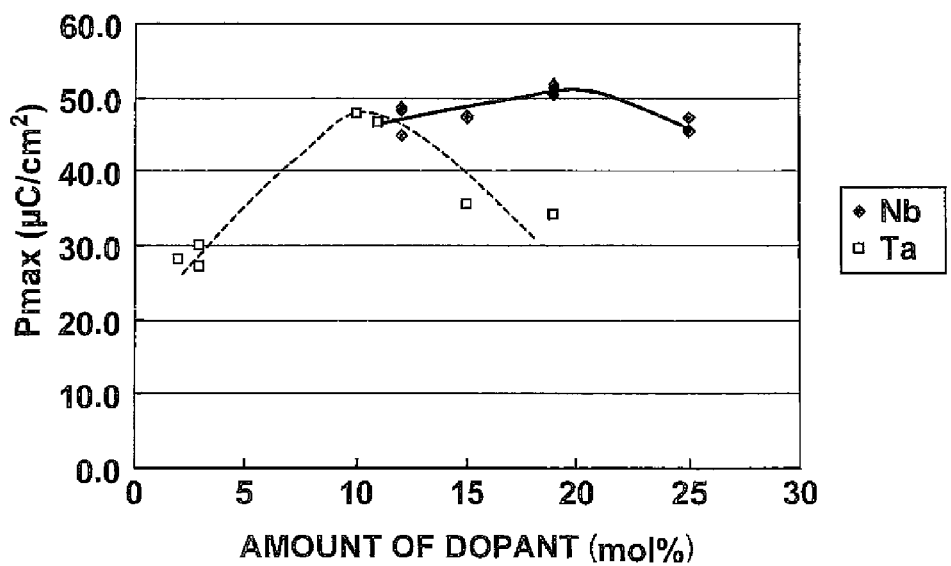
FIG. 9 is a diagram indicating a relationship between the magnitude of the maximum polarization Pmax and the amount M of B-site donor ions with which each ferroelectric film produced in an experimental example 1 is doped.

FIG. 9 shows a relationship between the magnitude of the maximum polarization Pmax and the amount M of B-site donor ions (the mole fraction in the B-sites) with which each ferroelectric film produced in the experimental example 1 is doped. The results indicated in FIG. 9 shows that when ferroelectric films of PZT are formed by sputtering, PZT can be doped with 10 mol % or more B-site donor ions without being doped with acceptor ions or a sintering assistant, and in particular, Nb-PZT doped with 10 to 25 mol % Nb ions exhibits high ferroelectric performance.

Figure 10:
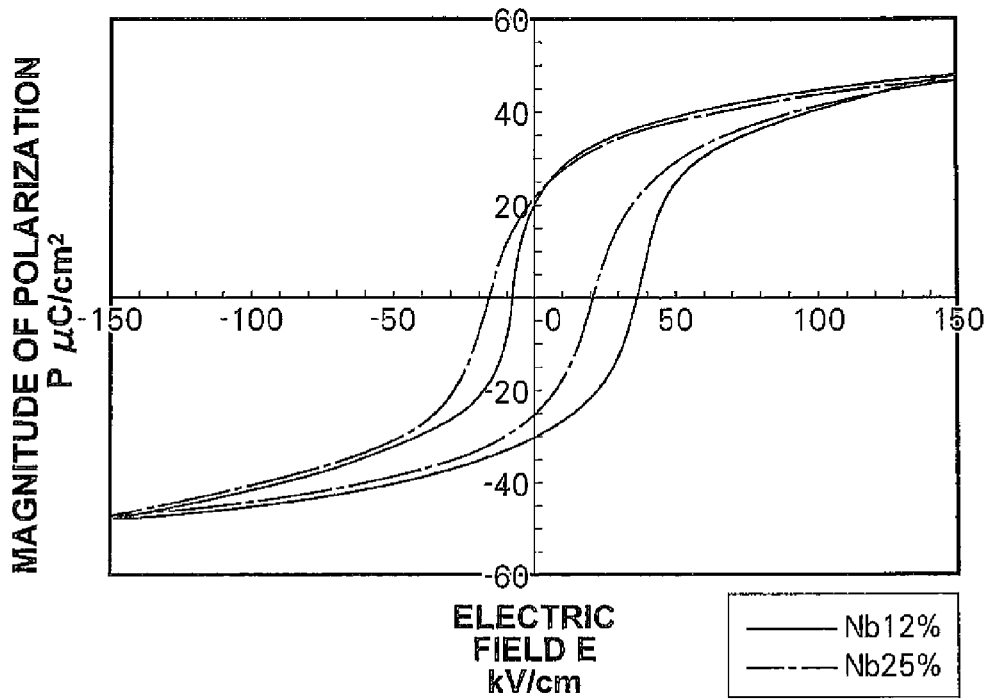
FIG. 10 is a diagram indicating P-E (polarization-versus-electric field) hysteresis curves of a first ferroelectric film produced in the experimental example 1 which is doped with 12 mol % niobium (Nb) and a second ferroelectric film produced in the experimental example 1 which is doped with 25 mol % Nb.

FIG. 10 shows P-E hysteresis curves of the ferroelectric films which are respectively doped with 12 mol % Nb and 25 mol % Nb. FIG. 10 shows that in the ferroelectric film of PZT doped with 12 mol % Nb, the difference between the absolute values of the coercive electric field Ec1 on the negative-electric-field side and the coercive electric field Ec2 on the positive-electric-field side is great, i.e., the P-E hysteresis exhibits great asymmetry. FIG. 10 also shows that in the ferroelectric film of PZT doped with 25 mol % Nb, the difference between the absolute values of the coercive electric field Ec1 on the negative-electric-field side and the coercive electric field Ec2 on the positive-electric-field side is small, i.e., the P-E hysteresis is near to symmetry.

8.2 Experimental Example 2

8.2.1 Production of Experimental Example 2

Two different (first and second) samples of ferroelectric films in the experimental example 2 have been produced. The first and second samples are doped with different amounts of bismuth (Bi) as an A-site donor and niobium (Nb) as a B-site donor. The production process in the experimental example 2 is similar to the experimental example 1 except that the target is changed for doping the first and second samples with the different amounts of Bi and Nb.

8.2.2 EDX Measurement

The compositions of the ferroelectric films as the first and second samples in the experimental example 2 have been analyzed by EDX (energy-dispersive X-ray spectrometry). The analysis results indicate that the first and second samples in the experimental example 2 are respectively a ferroelectric film of PZT doped with 14 mol % Nb and 6 mol % Bi and a ferroelectric film of PZT doped with 16 mol % Nb and 9 mol % Bi.

8.2.3 P-E Hysteresis Measurement

Figure 11:
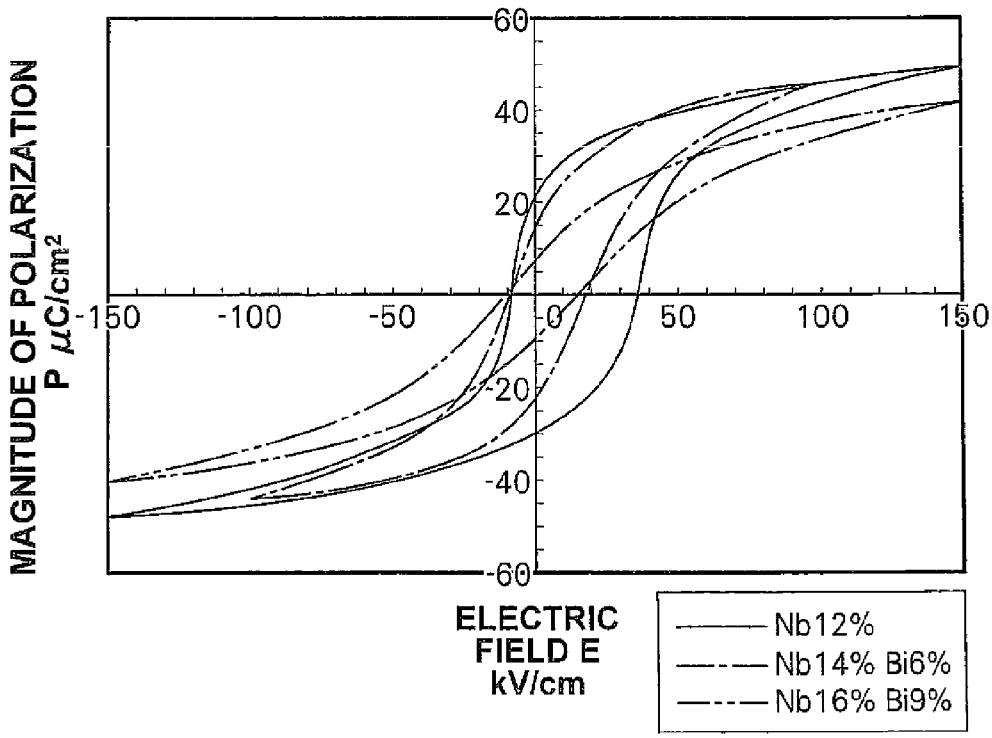
FIG. 11 is a diagram indicating P-E (polarization-versus-electric field) hysteresis curves of the first ferroelectric film produced in the experimental example 1 which is doped with 12 mol % Nb, a first ferroelectric film produced in an experimental example 2 which is doped with 14 mol % Nb and 6 mol % bismuth (Bi), and a second ferroelectric film produced in the experimental example 2 which is doped with 16 mol % Nb and 9 mol % Bi.

The P-E (polarization-versus-electric field) hystereses of the ferroelectric films as the first and second samples in the experimental example 2 have been measured. FIG. 11 shows P-E hysteresis curves of the first sample (ferroelectric film) in the experimental example 2 which is doped with 14 mol % Nb and 6 mol % Bi, and the second sample (ferroelectric film) in the experimental example 2 which is doped with 16 mol % Nb and 9 mol % Bi. In addition, FIG. 11 also shows the P-E hysteresis of the ferroelectric film in the experimental example 1 which is doped with 12 mol % Nb for comparison. As indicated in FIG. 11, although the difference between the absolute values of the coercive electric field Ec1 on the negative-electric-field side and the coercive electric field Ec2 on the positive-electric-field side is great in the P-E hysteresis of the ferroelectric film in the experimental example 1 which is doped with 12 mol % Nb and no bismuth, the difference between the absolute values of the coercive electric field Ec1 on the negative-electric-field side and the coercive electric field Ec2 on the positive-electric-field side is small (i.e., the P-E hysteresis is near to symmetry) when the ferroelectric film is codoped with Bi and Nb.

8.3 Experimental Example 3

8.3.1 Effect of Rings

First, five rings (annular metal plates) 250a of stainless steel have been arranged around a target T having a diameter of 120 mm in a commercially available REF sputtering system so as to realize the arrangement as illustrated in FIG. 3. The rings 250a have an inner diameter of 130 mm, an outer diameter of 180 mm, and a thickness of 1 mm, and are maintained at the ground potential. The rings 250a are stacked so as to be spaced from each other in the vertical direction by placing conductive spacers 250b between the rings 250a. Each of the conductive spacers 250b has a columnar shape with a diameter of 10 mm and a thickness of 5 mm. Since the extent of the conductive spacers 250b in the horizontal directions is sufficiently small compared with the dimensions of the rings 250a, the gas G introduced into the vacuum chamber 210 can readily reach the target T through the gaps 204 between the rings 250a without interference with the conductive spacers 250b.

Figure 12:
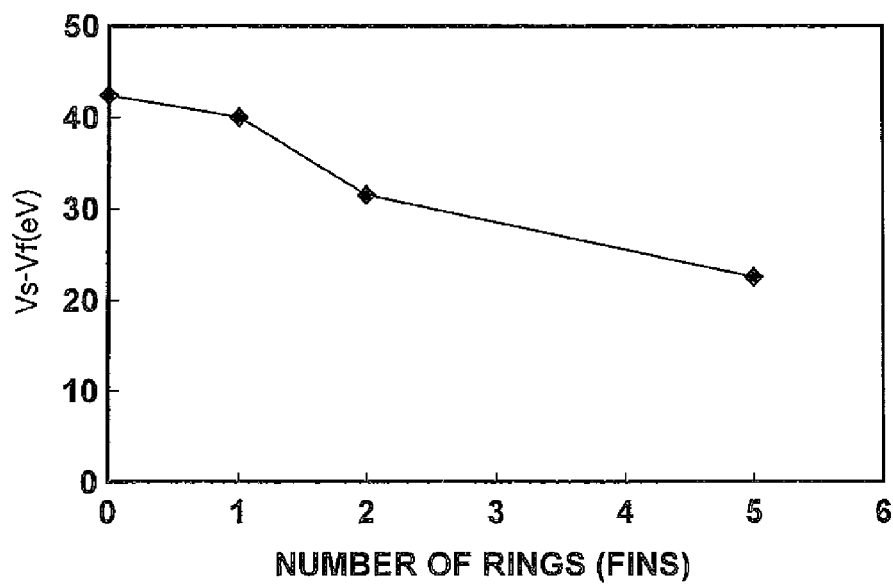
FIG. 12 is a diagram indicating as a result of measurement of an experimental example 3a relationship between the number of rings and the difference between the plasma potential and the floating potential.

In the above arrangement, the distance between the substrate B and the target T has been set at 60 mm, and RF power of 700 W has been applied from the RF power supply 13 to the plasma electrode 12 in the atmosphere of a mixture of Ar and 2.5 volume percent $O_2$ at the pressure of 0.5 Pa so as to generate plasma. Then, the plasma potential Vs and the floating potential Vf have been measured as Vs=38 V and Vf=16 V, i.e., Vs−Vf=22 V. Further, the plasma potential Vs and the floating potential Vt have been measured while changing the number of the rings 250a from zero to four under a similar condition. FIG. 12 shows a relationship between the number of rings 250a and the difference between the plasma potential Vs and the floating potential Vf.

As indicated in FIG. 12, the difference Vs−Vf has been measured 43 V in the arrangement without the rings 250a. The measured difference Vs−Vf decreases with increase in the number of the rings 250a. For example, the difference Vs−Vf has been measured 33 V in the arrangement having two rings 250a, and 22 V in the arrangement having five rings 250a. Therefore, it has been confirmed that the difference Vs−Vf can be controlled by changing the number of the rings 250a.

8.3.2 Production of Experimental Example 3

In the experimental example 3, a plurality of samples of ferroelectric films have been produced as follows.

First, substrates having an electrode have been produced by forming on 25 mm square substrates of silicon (Si) an adhesion layer of titanium (Ti) having a thickness of 30 nm and a lower electrode of iridium (Ir) having a thickness of 300 nm in this order.

Next, a plurality of different types of Nb-doped PZT-based ferroelectric films in which the PZT-based ferroelectric films are respectively doped with different amounts of niobium (Nb) have been respectively formed on the above substrates under a similar plasma condition to that mentioned in the preceding section 8.3.1 by using a plurality of different targets having different compositions in the RF sputtering system mentioned in the preceding section 8.3.1 in which the five rings 250a are arranged. In all the Nb-doped PZT-based ferroelectric films, the molar ratio between Zr and Ti has been adjusted to 53:48. During the plasma formation, the plasma potential Vs and the floating potential Vf have been measured as Vs=38 V and Vf=16 V, i.e., Vs−Vf=22 V. The film-formation temperature Ta has been 450° C., and the thicknesses of the ferroelectric films have been 5 micrometers.

Thereafter, an upper electrode of platinum (Pt) having a thickness of 100 nm has been formed on each of the plurality of Nb-PZT ferroelectric film by sputtering. Thus, production of a plurality of ferroelectric device respectively containing the different types of Nb-doped PZT-based ferroelectric films as the first samples in the experimental example 3 has been completed.

In addition, a plurality of second samples of ferroelectric films in the experimental example 3 have also been produced in a similar manner to the plurality of first samples of ferroelectric films in the experimental example 3. The second samples in the experimental example 3 are a plurality of different types of Ta-doped PZT-based ferroelectric films, which are PZT-based ferroelectric films respectively doped with different amounts of tantalum (Ta).

8.3.3 EDX Measurement

The compositions of the ferroelectric films as the first and second samples in the experimental example 3 have been analyzed by EDX (energy-dispersive X-ray spectrometry).

The ferroelectric film as every sample in the experimental example 3 has been found to have a composition expressed as $$Pb_{1+\delta}[(Zr_{0.52}Ti_{0.48})_{1-y}M_y]O_z,$$

where M represents niobium (Nb) or tantalum (Ta). The compositions y of the Nb-PZT film in the first samples have been found to be respectively 0.12, 0.15, 0.18, and 0.25, and the compositions y of the Ta-PZT film in the second samples have been found to be respectively 0.02 to 0.20. In every ferroelectric film, $1+\delta$ have been found to be 1.02 to 1.10. That is, every ferroelectric film in the first and second samples in the experimental example 3 has been found to be rich in lead. Since the intensity of the observed oxygen K-line peak in every ferroelectric film has been weak, the composition z of oxygen has not been able to be determined, although the composition z of oxygen has been roughly estimated to be in the range greater than two and not greater than three.

8.3.4 SEM Observation of Cross Section

The cross sections of the ferroelectric films as the first and second samples in the experimental example 3 have been observed by SEM (Scanning Electron Microscope), and it has been confirmed that every ferroelectric film in the experimental example 3 is a film having a columnar-grain structure constituted by a great number of columnar grains which extend approximately perpendicular to the surface of the substrate and have the average diameter of approximately 150 nm.

8.3.5 XRD Analysis

The crystal structures of the ferroelectric films as the first and second samples in the experimental example 3 have been analyzed by XRD (X-ray diffraction).

Each of the Nb-PZT ferroelectric films doped with 12 to 18 mol % Nb in the first samples has been found to be a (100)-oriented perovskite-structure film, and (100), (110), and (111) peaks have been observed in the Nb-PZT ferroelectric film doped with 25 mol % Nb. In addition, every Ta-PZT ferroelectric film in the second samples has also been found to be a (100)-oriented perovskite-structure film.

8.3.6 P-E Hysteresis Measurement

The P-E (polarization-versus-electric field) hystereses of the ferroelectric films as the first and second samples in the experimental example 3 have been measured, and the magnitude of polarization ($\mu C/cm^2$) at the electric field E=100 kV/cm (at which the polarization is almost saturated) has been obtained as the magnitude of the maximum polarization Pmax ($\mu C/cm^2$).

Figure 13:
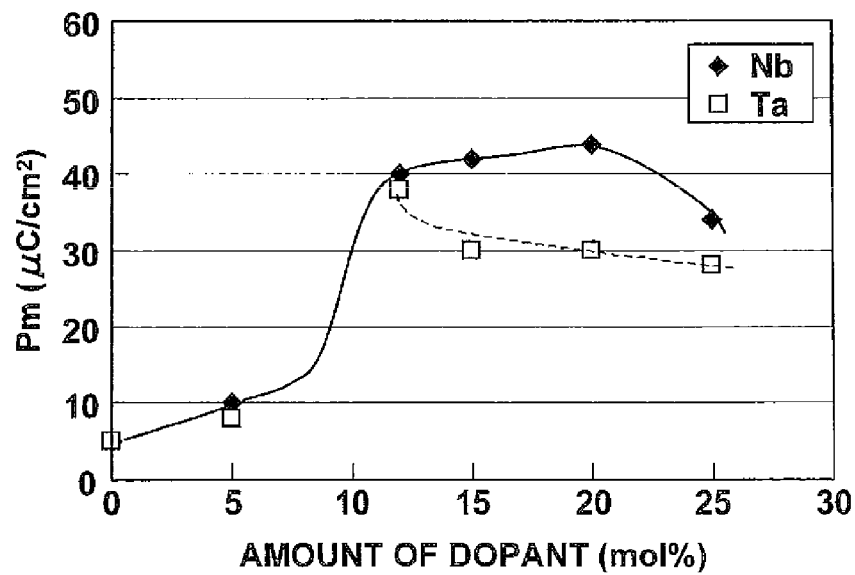
FIG. 13 is a diagram indicating a relationship between the magnitude of the maximum polarization Pmax and the amount M of B-site donor ions with which each ferroelectric film produced in the experimental example 3 is doped.

FIG. 13 shows a relationship between the magnitude of the maximum polarization Pmax and the amount M of B-site donor ions (the mole fraction in the B-sites) with which each ferroelectric film produced in the experimental example 3 is doped. The results indicated in FIG. 13 shows that when ferroelectric films of PZT are formed by using the sputtering system explained in the previous section 8.3.1, PZT can be doped with 10 mol % or more B-site donor ions without being doped with acceptor ions or a sintering assistant, and in particular, Nb-PZT doped with 10 to 25 mol % Nb ions exhibits high ferroelectric performance.

The P-E hysteresis curve of the ferroelectric film of PZT doped with 12 mol % Nb shows that the difference between the absolute values of the coercive electric field Ec1 on the negative-electric-field side and the coercive electric field Ec2 on the positive-electric-field side is great, i.e., the P-E hysteresis exhibits great asymmetry. On the other hand, the P-E hysteresis curve of the ferroelectric film of PZT doped with 25 mol % Nb shows that the difference between the absolute values of the coercive electric field Ec1 on the negative-electric-field side and the coercive electric field Ec2 on the positive-electric-field side is small, i.e., the P-E hysteresis is near to symmetry.

8.4 Experimental Example 4

8.4.1 Production of Experimental Example 4

In the experimental example 4, a Nb-PZT film and a plurality of intrinsic PZT films have been produced under a similar condition to the experimental example 1 except for the specific part of the film-formation condition indicated below.

A target of $Pb_{1.3}Zr_{0.52}Ti_{0.48}O_3$ is used for formation of the intrinsic PZT films, and a target of $Pb_{1.3}Zr_{0.43}Ti_{0.44}Nb_{0.13}O_3$ is used for formation of the intrinsic Nb-PZT film.

During the film formation, each substrate has been held in a floating state at a distance of 60 mm from the target, and a ground (earth) has been arranged apart from the substrate outside the space between the substrate and the target. The plasma potential Vs and the floating potential Vf have been measured, and the difference Vs−Vf has been obtained as approximately 12 V. At this time, the floating potential Vf is the potential in the vicinity of the substrate, (specifically, the potential at the distance of approximately 10 mm from the substrate in this example).

The Nb-PZT film has been formed at the film-formation temperature Ts of 525° C., and the intrinsic PZT films have been formed at different film-formation temperatures Ts other than 525° C. in the range of 400° C. to 600° C.

8.4.2 XRD Analysis

Figure 14:
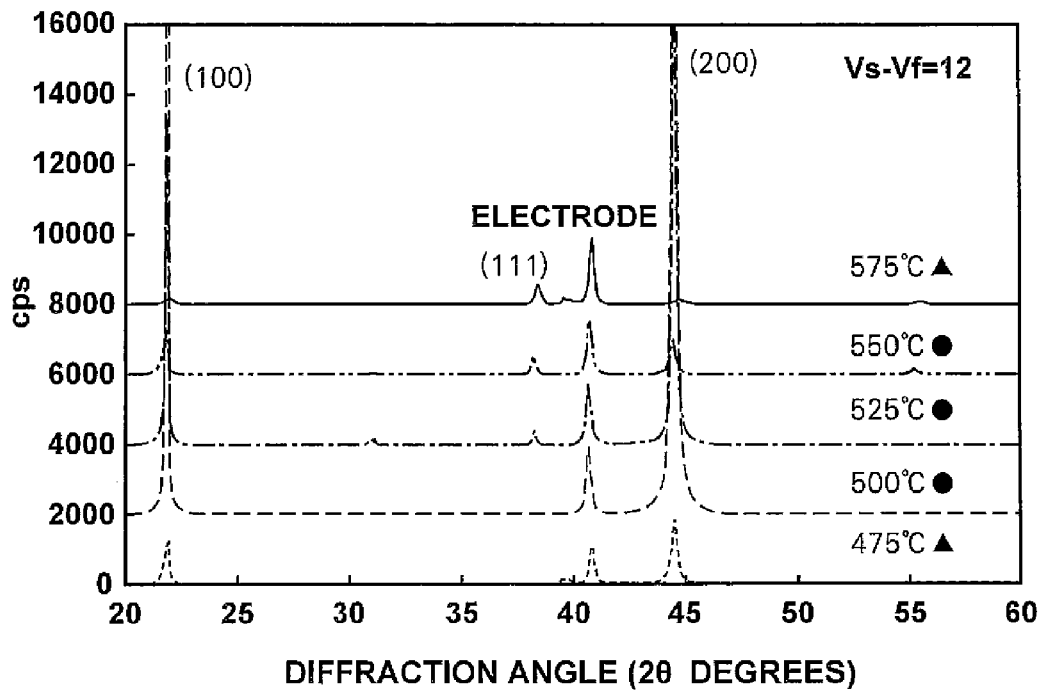
FIG. 14 shows XRD (X-ray diffraction) profiles of a Nb-PZT film and intrinsic PZT films in an experimental example 4.

The crystal structures of the Nb-PZT film and the intrinsic PZT films in the experimental example 4 have been analyzed by XRD (X-ray diffraction). FIG. 14 shows XRD profiles of the Nb-PZT film and the intrinsic PZT films as the samples in the experimental example 4. As indicated in FIG. 14, the Nb-PZT film and the intrinsic PZT films formed at the film-formation temperature Ts of 475° C. to 575° C. under the condition that the difference Vs−Vf is approximately 12 V have been observed to be composed of perovskite crystals having crystal orientation. However, the intrinsic PZT film formed at the film-formation temperature Ts of 450° C. under the condition that the difference Vs−Vf is approximately 12 V has been observed to be mainly composed of the pyrochlore phase, and therefore the corresponding result is indicated by a cross in FIG. 19. In addition, the pyrochlore phase has been observed in part of a plurality of samples formed at the film-formation temperature Ts of 475° C. under the condition that the difference Vs−Vf is approximately 12 V. Further, disorder of the orientation has begun to appear at the film-formation temperature Ts of 575° C. under the condition that the difference Vs−Vf is approximately 12 V. Therefore, the results at the film-formation temperature Ts of 475° C. and 575° C. under the condition that the difference Vs−Vf is approximately 12 V are indicated by the filled triangles in FIGS. 14 and 19, and the result at the film-formation temperature Ts of 600° C. under the condition that the difference Vs−Vf is approximately 12 V is indicated by the filled triangle in FIG. 19. Furthermore, perovskite crystals having satisfactory crystal orientation have been stably obtained in the Nb-PZT film and the intrinsic PZT films formed at the film-formation temperature Ts of 500° C. to 550° C. under the condition that the difference Vs–Vf is approximately 12 V, and therefore the corresponding results are indicated by filled circles in FIGS. 14 and 19.

8.4.3 XRF Analysis

Figure 15:
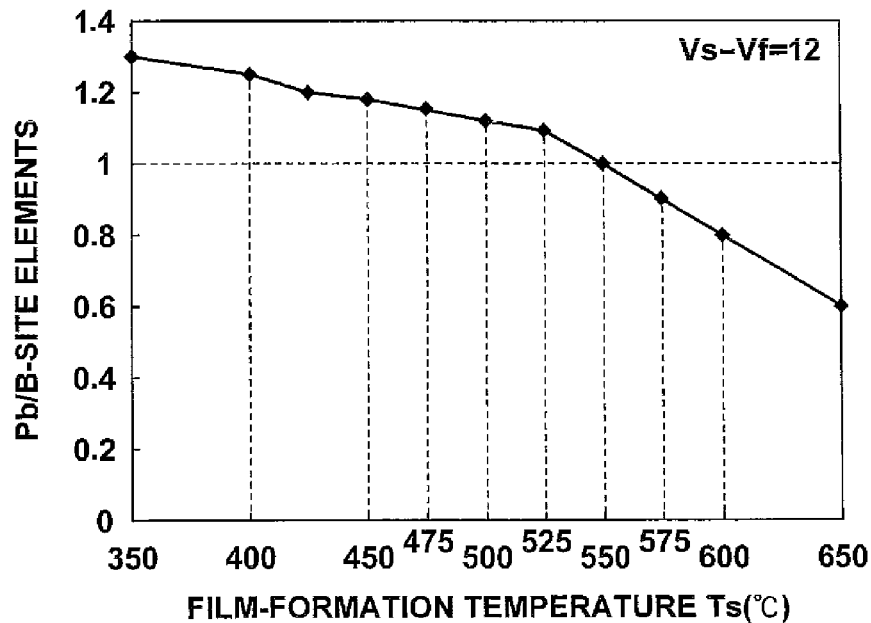
FIG. 15 is a diagram indicating results of composition analysis of the Nb-PZT film and the intrinsic PZT films in the experimental example 4.

The compositions of the Nb-PZT film and the intrinsic PZT films as the samples in the experimental example 4 have been analyzed by XRF (X-ray fluorescence). FIG. 15 shows the results of composition analysis of the Nb-PZT film and the intrinsic PZT films as the samples in the experimental example 4. In FIG. 15, the ordinate indicates the ratio of the molar amount of lead (Pb) to the total molar amount of the B-site elements (i.e., the total molar amount of the Zr and Ti atoms, or the Zr, Ti, and Nb atoms).

FIG. 15 indicates that the above ratio of the molar amount of lead (Pb) to the total molar amount of the B-site elements is in the range of 1.0 to 1.3 in the case where the film-formation temperature Ts is in the range of 350° C. to 550° C. under the condition that the difference Vs–Vf is approximately 12 V. That is, it has been confirmed that films of PZT or Nb-PZT can be formed without loss of lead at the film-formation temperature Ts of 350° C. to 550° C. under the condition that the difference Vs–Vf is approximately 12V. However, it has been observed that perovskite crystals cannot grow at the film-formation temperature Ts equal to or lower than 450° C. due to the low film-formation temperature. In addition, it has also been observed that perovskite crystals cannot grow at the film-formation temperature Ts equal to or higher than 600° C. due to loss of lead.

For example, the composition of the Nb-PZT film formed at the film-formation temperature Ts of 525° C. under the condition that the difference Vs–Vf is approximately 12 V has been determined to be $Pb_{1.12}Zr_{0.43}Ti_{0.44}Nb_{0.13}O_3$.

8.4.4 Ferroelectric Performance

The piezoelectric constant $d_{31}$ of the Nb-PZT film having the composition $Pb_{1.12}Zr_{0.43}Ti_{0.44}Nb_{0.13}O_3$ has been measured by using the cantilever technique, and determined to be as high as 250 pm/V. That is, the piezoelectric performance of the Nb-PZT film in the experimental example 4 has been confirmed to be satisfactory.

8.5 Experimental Example 5

During film formation in the experimental example 5, the ground (earth) is arranged near the substrate. The plasma potential Vs and the floating potential Vf have been measured in a similar manner to the experimental example 3, and the difference Vs–Vf has been obtained as approximately 42 V.

Figure 16:
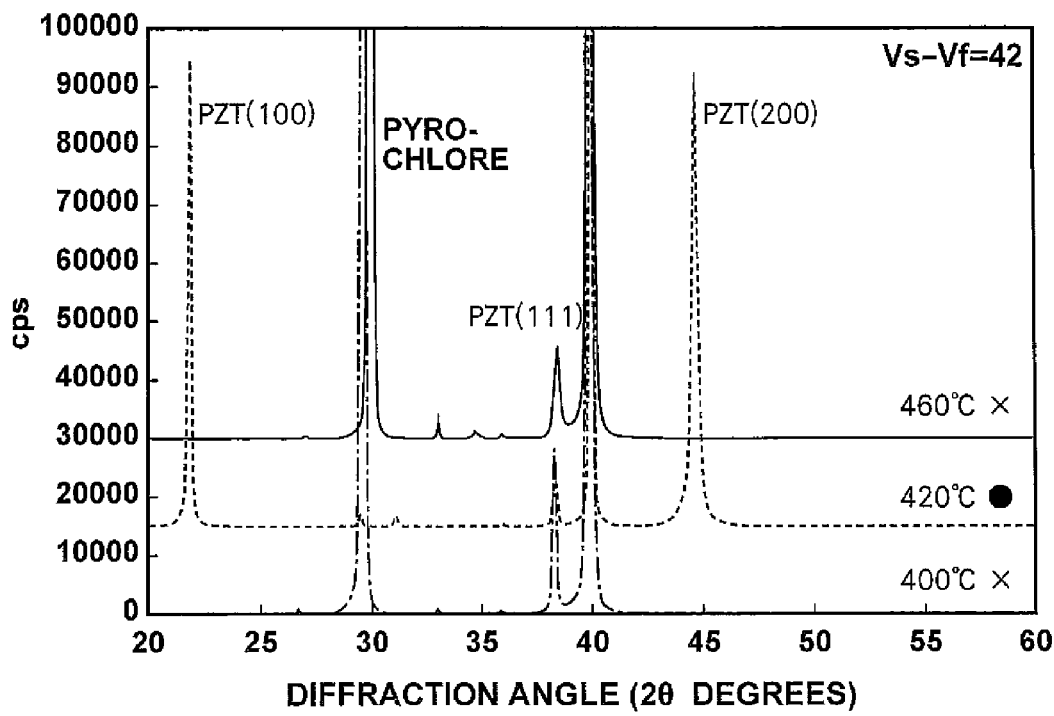
FIG. 16 is a diagram indicating XRD profiles of major ferroelectric films produced in an experimental example 5.

In the experimental example 5, a plurality of PZT films as a plurality of samples have been formed under the above plasma condition at different film-formation temperatures Ts in the range of 380° C. to 500° C., and analyzed by XRD (X-ray diffraction). FIG. 16 shows XRD profiles of major ferroelectric films produced in the experimental example 5.

As indicated in FIG. 16, perovskite crystals having satisfactory crystal orientation have been obtained at the film-formation temperature Ts of 420° C. under the condition that the difference Vs–Vf is approximately 42 V. Thus, the corresponding result of the XRD analysis is also indicated by a filled circle in FIGS. 16 and 19. However, the PZT films formed at the film-formation temperature Ts of 400° C. or lower, or 460° C. or higher under the condition that the difference Vs–Vf is approximately 42 V are mainly composed of the pyrochlore phase, and therefore the corresponding results of the XRD analysis are indicated by crosses in FIGS. 16 and 19.

Figure 17:
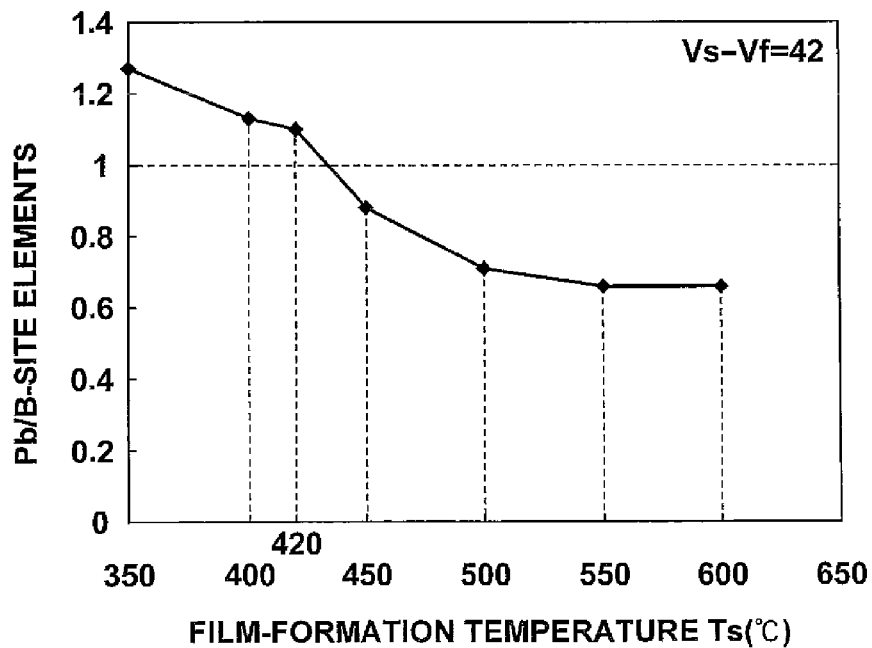
FIG. 17 is a diagram indicating results of composition analysis of ferroelectric film produced in the experimental example 5.

The compositions of the PZT films in the experimental example 5 have been analyzed in a similar manner to the experimental example 3. FIG. 17 shows the results of the composition analysis of the samples in the experimental example 5. FIG. 17 indicates that the ratio of the molar amount of lead (Pb) to the total molar amount of the B-site elements is in the range of 1.0 to 1.3 in the case where the film-formation temperature Ts is equal to or higher than 350° C. and lower than 450° C. and the difference Vs–Vf is approximately 42 V. However, it has been observed that perovskite crystals cannot grow at the film-formation temperature Ts equal to or lower than 400° C. due to the low film-formation temperature.

8.6 Experimental Example 6

In the experimental example 6, PZT films and Nb-PZT films have been formed at various film-formation temperatures under various conditions with different values of the difference Vs–Vf, which are realized by changing the position of the ground (earth). Specifically, the films in the experimental example 6 have been formed under the conditions in which the values of the difference Vs–Vf are approximately 22, 32, and 45, and 55 V, and the film-formation temperature Ts is differentiated according to the values of the difference Vs–Vf as indicated in FIG. 19. Among others, the Nb-PZT films in the experimental example 6 have been formed at the film-formation temperature Ts of 525° C. under the conditions in which the values of the difference Vs–Vf are approximately 32 and 45 V, similar to the Nb-PZT film in the experimental example 4 which have been formed at the film-formation temperature Ts of 525° C. under the condition that the difference Vs–Vf is 12 V. The other samples in the experimental example 6 are PZT films.

Figure 18:
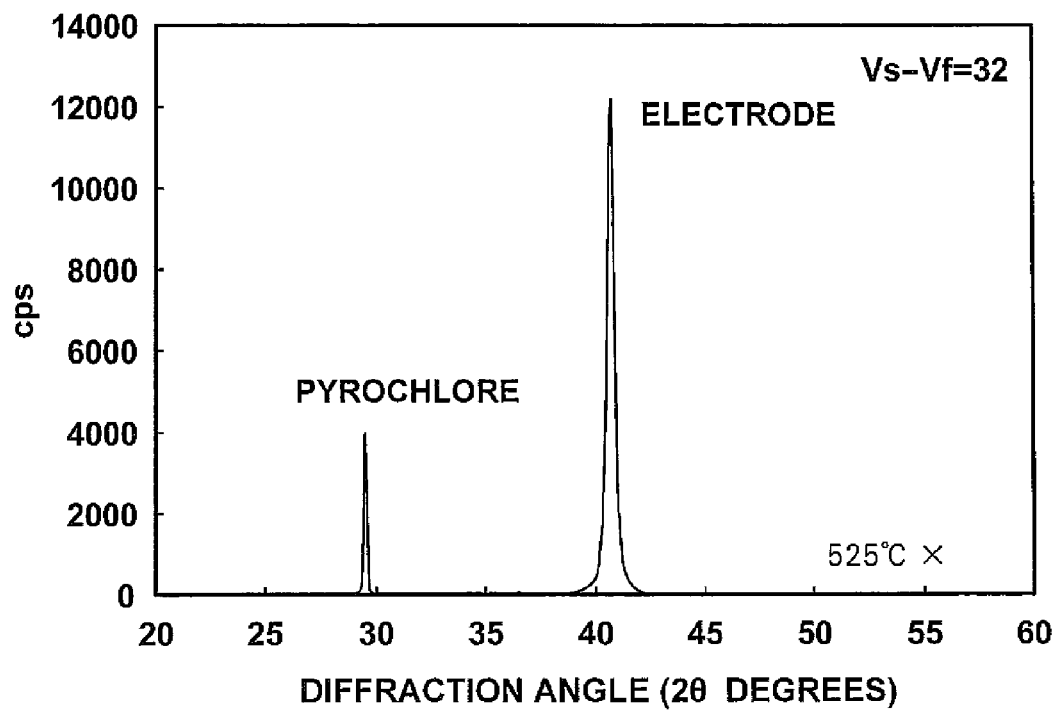
FIG. 18 is a diagram indicating an XRD profile of a ferroelectric film produced in an experimental example 6 under a condition that the difference Vs–Vf between the plasma potential and the floating potential is approximately 32 V, and the film-formation temperature Ts is 525° C.

The crystal structures and the compositions of the PZT films and Nb-PZT films in the experimental example 6 are analyzed in similar manners to the experimental example 4. FIG. 18 shows an XRD profile of a sample of Nb-PZT film produced in the experimental example 6 under the condition that the difference Vs–Vf between the plasma potential and the floating potential is approximately 32 V, and the film-formation temperature Ts is 525° C. The result of FIG. 18 shows that the sample of Nb-PZT film is mainly composed of the pyrochlore phase.

8.7 Summary of Experimental Examples 4 to 6

FIG. 19 is a diagram indicating the relationships between the film-formation condition (the film-formation temperature Ts and the difference Vs–Vf) and the film characteristics of the PZT-based ferroelectric films produced in the experimental examples 4 to 6. In FIG. 19, the abscissa corresponds to the film-formation temperature Ts, and the ordinate corresponds to the difference Vs–Vf. In addition, a line indicating the relationship Vs–Vf=−0.2Ts+100 and a line indicating the relationship Vs–Vf=−0.2Ts+130 are indicated in FIG. 19.

FIG. 19 shows that in the case where the film-formation condition satisfies the aforementioned inequality (1) (Ts≧400° C.) and the aforementioned inequalities (2) (−0.2Ts+100<Vs–Vf<−0.2Ts+130) during formation of films of PZT and Nb-PZT, perovskite crystals containing the pyrochlore phase at most in very small portions can stably grow, and loss of lead can be stably suppressed, so that it is possible to stably grow a high-quality ferroelectric film having satisfactory crystal structure and composition. Although the major part of the data indicated in FIG. 19 are obtained from intrinsic PZT films, and the number of Nb-PZT films indicated in FIG. 19 is only three, the conditions for forming preferable Nb-PZT films are similar to the conditions for forming preferable PZT films.

8.8 Experimental Example 7

In the experimental example 7, a Nb-PZT film and a plurality of intrinsic PZT films have been produced under a similar condition to the experimental example 1 except for the specific part of the film-formation condition indicated below.

A target of $Pb_{1.3}Zr_{0.52}Ti_{0.48}O_3$ is used for formation of the intrinsic PZT films, and a target of $Pb_{1.3}Zr_{0.43}Ti_{0.44}Nb_{0.13}O_3$ is used for formation of the intrinsic Nb-PZT film.

In the film formation, the film-formation temperature Ts has been maintained at 525° C., and RF power of 2.5 W/cm² has been applied to the target. The distance D between the substrate B and the target T has been set at 60 mm during formation of the Nb-PZT film, and at 40, 75, 100, and 120 mm during formation of the PZT films. FIGS. 20 to 24 show XRD profiles of major ferroelectric films produced in the experimental example 7.

As indicated in FIGS. 20 to 24, perovskite crystals having crystal orientation have been obtained at the film-formation temperature Ts of 525° C. under the condition that the substrate-target distance D is in the range of 40 to 100 mm. This range corresponds to the range of the film-formation rate from 0.5 mm/h to 1.2 mm/h as indicated in FIG. 5. That is, the perovskite crystals can be obtained at satisfactory manufacturing efficiency.

Figure 20:
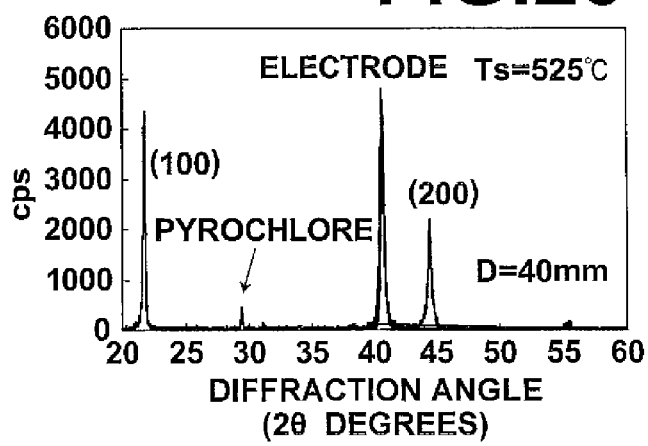
FIG. 20 is a diagram indicating an XRD profile of a first one of major ferroelectric films produced in an experimental example 7.
Figure 21:
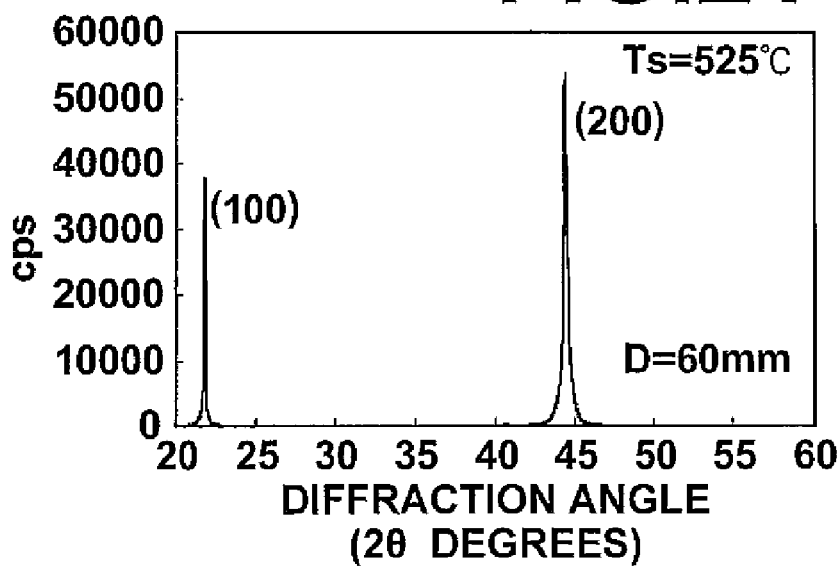
FIG. 21 is a diagram indicating an XRD profile of a second one of the major ferroelectric films produced in the experimental example 7.
Figure 22:
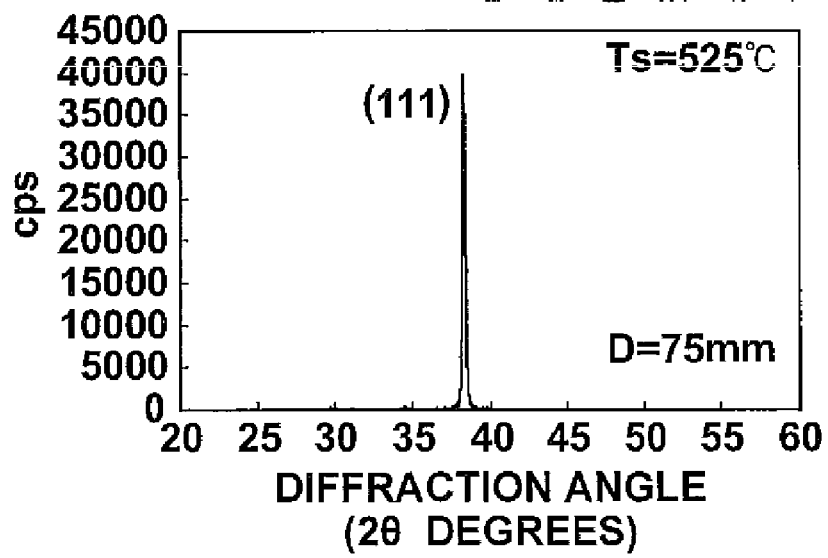
FIG. 22 is a diagram indicating an XRD profile of a third one of the major ferroelectric films produced in the experimental example 7.
Figure 23:
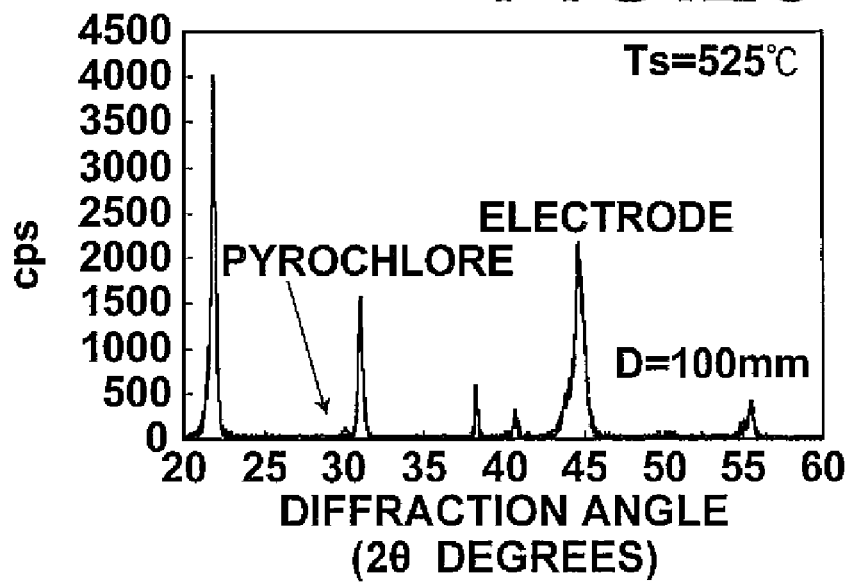
FIG. 23 is a diagram indicating an XRD profile of a fourth one of the major ferroelectric films produced in the experimental example 7.
Figure 24:
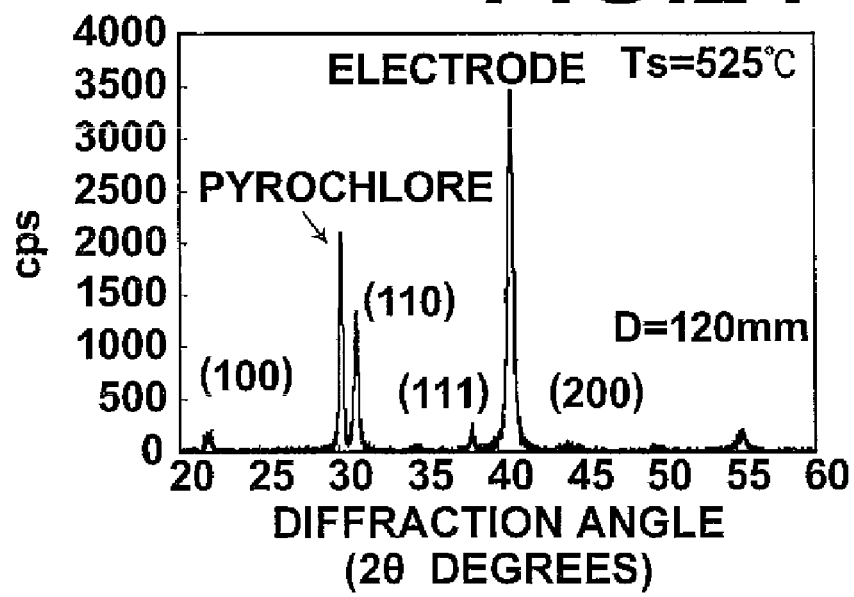
FIG. 24 is a diagram indicating an XRD profile of a fifth one of the major ferroelectric films produced in the experimental example 7.

As indicated in FIG. 24, the PZT film formed under the condition that the substrate-target distance D is 120 mm is mainly composed of the pyrochlore phase. (Therefore, the result of the XRD analysis corresponding to FIG. 24 is also indicated by a cross in FIG. 25.) It is possible to consider that the long substrate-target distance D makes the film-formation rate too low for the perovskite crystals to sufficiently grow. As indicated in FIG. 23, the pyrochlore phase has begun to appear in part of samples of the PZT film formed under the condition that the substrate-target distance D is 100 mm. As indicated in FIG. 20, the pyrochlore phase also appears in the PZT film formed under the condition that the substrate-target distance D is 40 mm. (Therefore, the results of the XRD analysis corresponding to FIGS. 23 and 20 are also indicated by filled triangles in FIG. 25.) As indicated in FIGS. 21 and 22, perovskite crystals having satisfactory crystal orientation are stably grown in both of the Nb-PZT film formed under the condition that the substrate-target distance D is 60 mm and the PZT film formed under the conditions that the substrate-target distance D is 75 mm. (Therefore, the results of the XRD analysis corresponding to FIGS. 21 and 22 are also indicated by filled circles in FIG. 25.)

Further, the composition of the piezoelectric film the XRD profile of which is indicated in FIG. 21 (i.e., the Nb-PZT film formed under the condition that the substrate-target distance D is 60 mm) is analyzed by XRF (X-ray fluorescence), and the ratio of the molar amount of lead (Pb) to the total molar amount of the B-site elements (i.e., the total molar amount of the Zr, Ti, and Nb atoms) has been measured 1.02. That is, it has been confirmed that the Nb-PZT film can be formed without loss of lead at the film-formation temperature Ts of 525° C. under the condition that the substrate-target distance D is 60 mm.

After the formation of Nb-PZT film, an upper electrode of platinum (Pt) having a thickness of 100 nm has been formed on the Nb-PZT film by sputtering. Then, the piezoelectric constant $d_{31}$ of the Nb-PZT film has been measured by using the cantilever technique, and determined to be as high as 250 pm/V. That is, the piezoelectric performance of the Nb-PZT film in the experimental example 7 has been confirmed to be satisfactory.

On the other hand, the piezoelectric constant $d_{31}$ of the piezoelectric film the XRD profile of which is indicated in FIG. 23 (i.e., the PZT film which has been formed under the condition that the substrate-target distance D is 100 mm, and contains the pyrochlore phase in some portions) has been measured in a similar manner, and determined to be 110 pm/V.

8.9 Experimental Example 8

In the experimental example 8, a PZT film has been produced under a similar condition to the experimental example 7 except that the film-formation temperature Ts is 420° C. and the substrate-target distance D is 60 mm. The PZT film obtained under the above condition has been confirmed to be composed of (100)—oriented perovskite crystals having satisfactory crystal orientation although the PZT film contains the pyrochlore phase at most in very small portions.

8.10 Summary of Experimental Examples 7 and 8

FIG. 25 is a diagram indicating relationships between the film-formation condition (the film-formation temperature Ts and the substrate-target distance D) and the film characteristics of PZT-based ferroelectric films produced by non-thermal equilibrium processes in experimental examples including all the samples in the experimental examples 7 and 8 and other samples produced under different conditions. In FIG. 25, the abscissa corresponds to the film-formation temperature Ts, and the ordinate corresponds to the substrate-target distance D.

FIG. 25 shows that when films of PZT or Nb-PZT are formed under a film-formation condition concurrently satisfying the aforementioned inequalities (4) and (5) (i.e., $400 \leq Ts \leq 500$, and $30 \leq D \leq 80$), or the aforementioned inequalities (6) and (7) ($500 \leq Ts \leq 600$, and $30 \leq D \leq 100$), perovskite crystals containing the pyrochlore phase at most in very small portions can stably grow, and loss of lead (Pb defect) can be stably suppressed, so that a high-quality piezoelectric film having satisfactory crystal structure and composition can stably grow. Although the data indicated in FIG. 25 are obtained from both of the intrinsic PZT films and the Nb-PZT films, the conditions for forming preferable Nb-PZT films are similar to the conditions for forming preferable PZT films.

8.11 Experimental Example 9

In the experimental example 9, a Nb-PZT film and a plurality of intrinsic PZT films have been produced under a similar condition to the experimental example 1 except for the specific part of the film-formation condition indicated below.

A target of $Pb_{1.3}Zr_{0.52}Ti_{0.48}O_3$ is used for formation of the intrinsic PZT films, and a target of $Pb_{1.3}Zr_{0.43}Ti_{0.44}Nb_{0.13}O_3$ is used for formation of the intrinsic Nb-PZT film.

During the film formation, each substrate has been held in a floating state at a distance of 60 mm from the target, the film-formation temperature Ts is set at 525° C., and a ground (earth) has been arranged apart from the substrate outside the space between the substrate and the target. The Nb-PZT film has been formed at the plasma potential Vs of 23 V, and the intrinsic PZT films have been formed at different levels of the plasma potential Vs other than 23 V in the range of 10 to 50 V. The plasma potential Vs is adjusted by changing the position of the ground.

The crystal structures of the Nb-PZT film and the intrinsic PZT films in the experimental example 9 have been analyzed by XRD (X-ray diffraction), and it has been confirmed that perovskite crystals having crystal orientation are grown in the Nb-PZT film and intrinsic PZT films formed at the plasma potential Vs in the range of 10 to 38 V. FIGS. 26 to 29 show XRD profiles of the major ferroelectric films produced in the experimental example 9.

Figure 26:
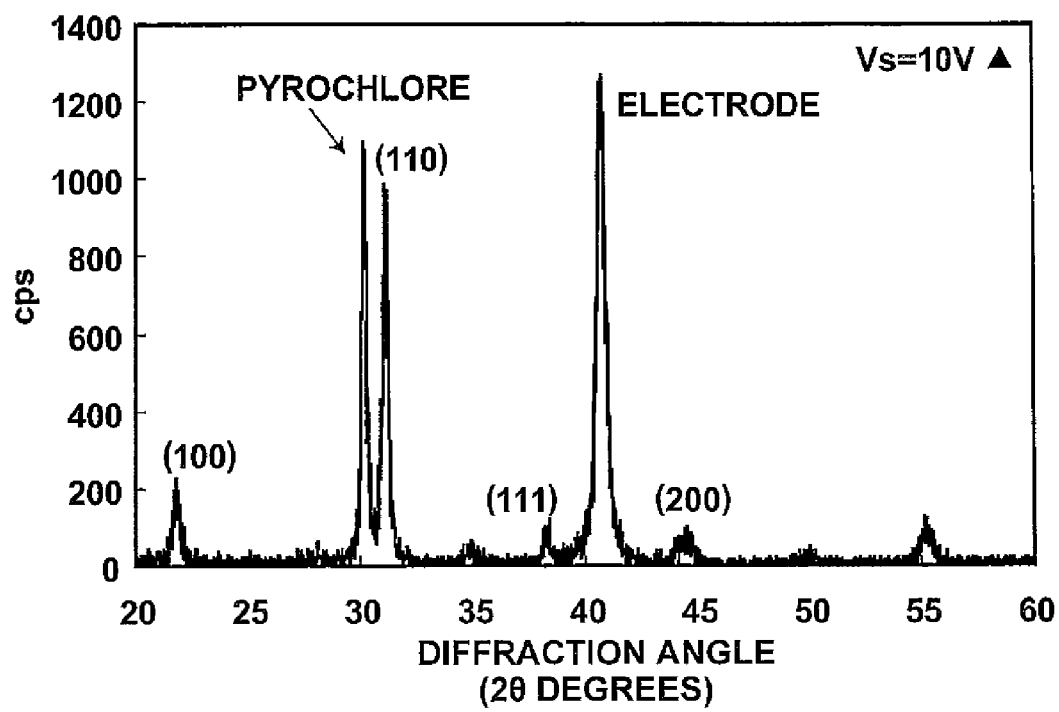
FIG. 26 is a diagram indicating an XRD profile of a first one of major ferroelectric films produced in an experimental example 9.
Figure 27:
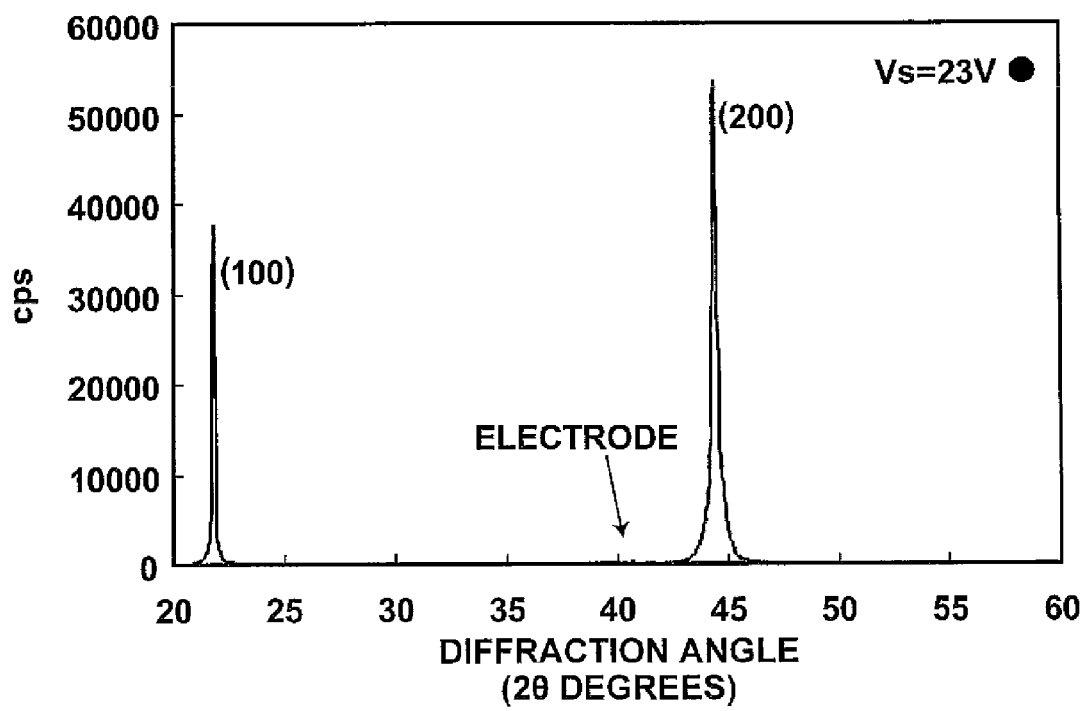
FIG. 27 is a diagram indicating an XRD profile of a second one of the major ferroelectric films produced in the experimental example 9.
Figure 28:
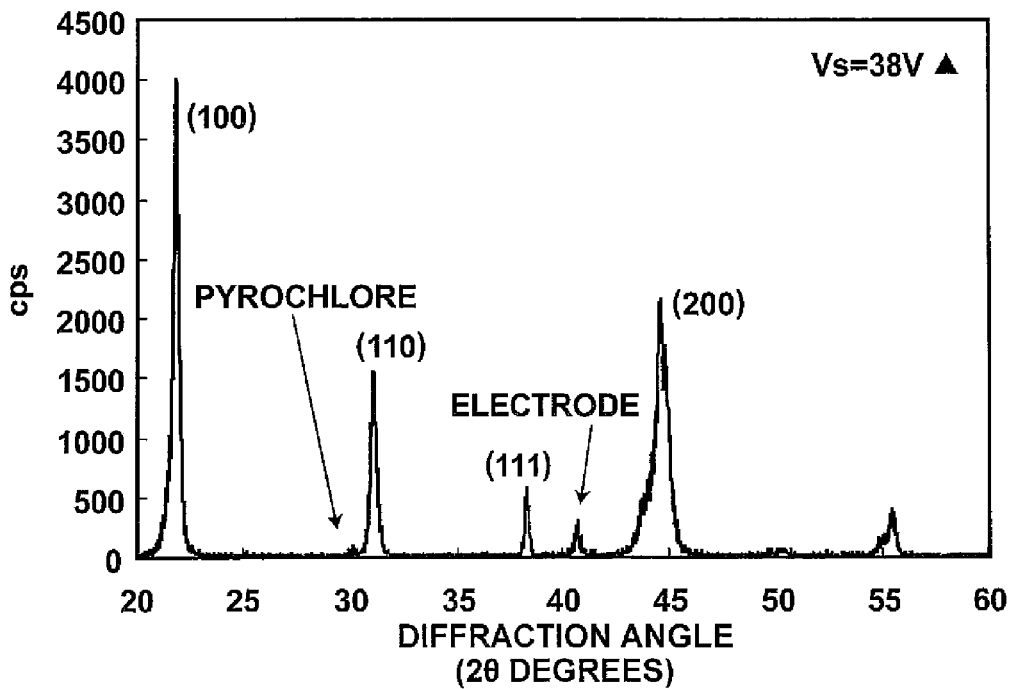
FIG. 28 is a diagram indicating an XRD profile of a third one of the major ferroelectric films produced in the experimental example 9.
Figure 29:
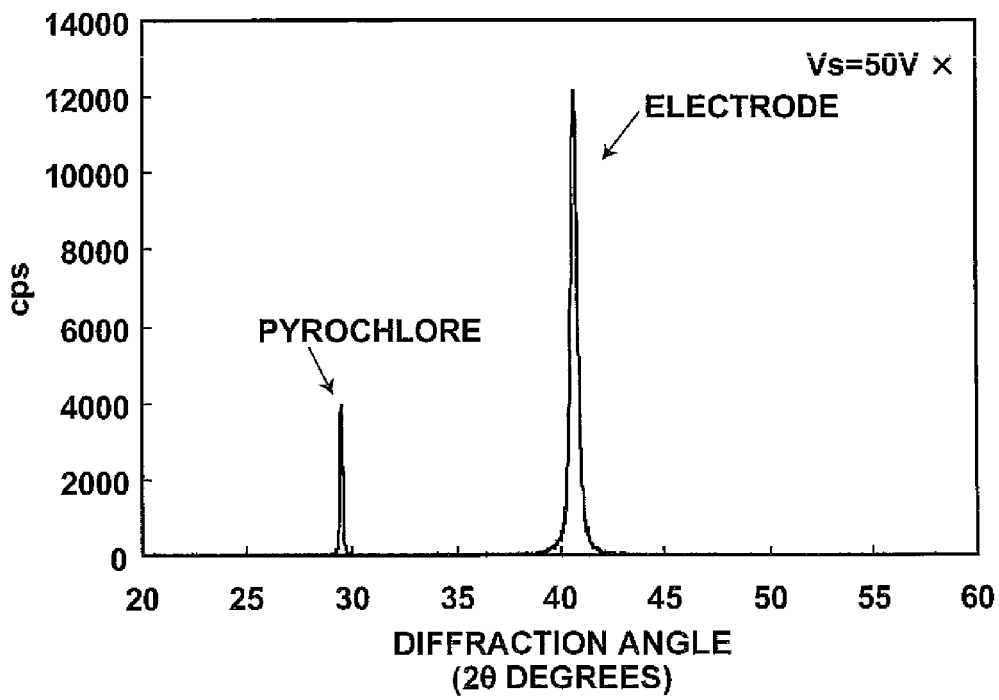
FIG. 29 is a diagram indicating an XRD profile of a fourth one of the major ferroelectric films produced in the experimental example 9.

Although growth of perovskite crystals having crystal orientation have been observed in some samples of the intrinsic PZT film formed at the plasma potential Vs of 10 V, disorder of the crystal orientation and the pyrochlore phase have been observed, as indicated in FIG. 26, in other samples of the intrinsic PZT film at the plasma potential Vs of 10 V. (Therefore, the result of the XRD analysis of the intrinsic PZT film formed at the plasma potential Vs of 10 V is indicated by a filled triangle in FIGS. 26 and 32.) In addition, disorder of the crystal orientation has begun to appear in the intrinsic PZT film formed at the plasma potential Vs of 38 V. (Therefore, the result of the XRD analysis of the intrinsic PZT film formed at the plasma potential Vs of 38 V is also indicated by a filled triangle in FIGS. 28 and 32.) The intrinsic PZT film formed at the plasma potential Vs of 50 V has been observed to be mainly composed of the pyrochlore phase. (Therefore, the result of the XRD analysis of the intrinsic PZT film formed at the plasma potential Vs of 50 V is also indicated by a cross in FIGS. 29 and 32.) Stable growth of perovskite crystals having satisfactory crystal orientation has been observed in the intrinsic PZT film formed at the plasma potential Vs of 23 V. (Therefore, the result of the XRD analysis of the intrinsic PZT film formed at the plasma potential Vs of 23 V is also indicated by a filled circle in FIGS. 27 and 32.)

Since the data indicated in FIGS. 26 to 29 are obtained from samples having different film thicknesses, the absolute values of the peak intensities greatly vary according to the samples. However, since the positions of the peaks indicating the crystal orientation and the relative intensities of the peaks do not depend on the film thicknesses, the crystallinity is not affected by the absolute values of the peak intensities. For example, since the intrinsic PZT film formed at the plasma potential Vs of 23 V indicated in FIG. 27 exhibits superior crystal orientation, the peak corresponding to the electrode is so small that the peak can be hardly observed.

8.12 Experimental Example 10

Figure 30:
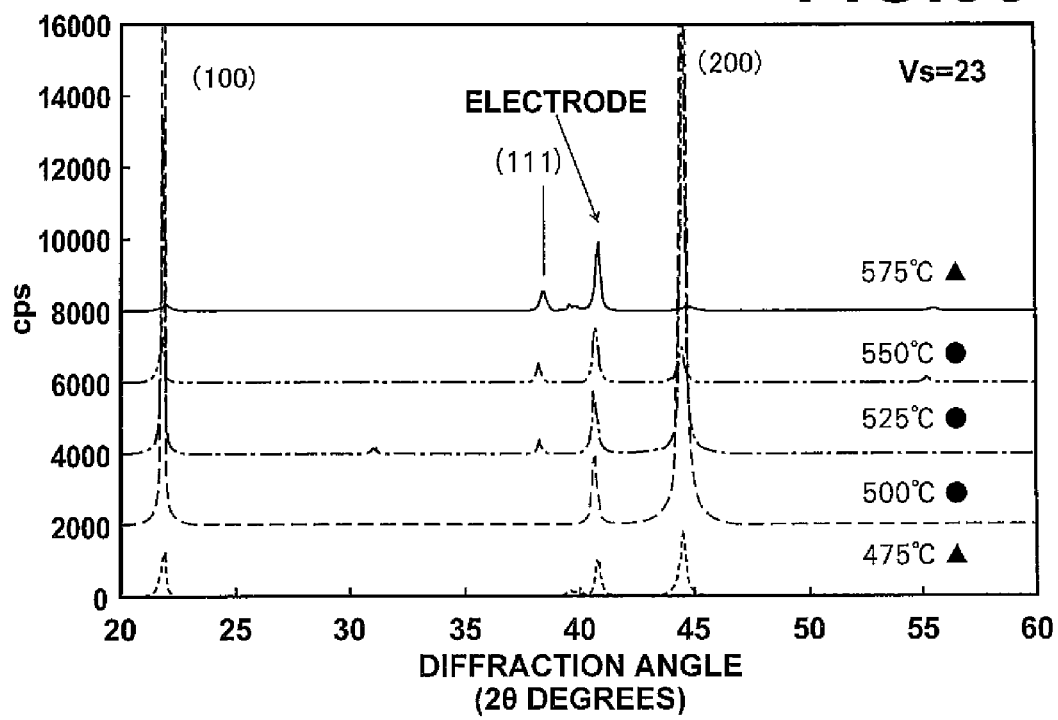
FIG. 30 is a diagram indicating XRD profiles of major ferroelectric films produced in an experimental example 10.

In the experimental example 10, a Nb-PZT film and a plurality of intrinsic PZT films have been produced at the plasma potential Vs of approximately 23 V and a plurality of film-formation temperatures Ts in the range of 450° C. to 600° C., and evaluated in a similar manner to the experimental example 1. Specifically, the Nb-PZT film has been formed at the film-formation temperature Ts of 525° C., and the plurality of intrinsic PZT films have been formed at other film-formation temperatures Ts in the above range. The crystal structures of the Nb-PZT film and the intrinsic PZT films in the experimental example 10 have been analyzed by XRD (X-ray diffraction). FIG. 30 shows XRD profiles of major ferroelectric films produced in the experimental example 10.

As indicated in FIG. 30, growth of perovskite crystals having crystal orientation has been observed in the ferroelectric films formed at the plasma potential Vs of approximately 23 V and the film-formation temperatures Ts in the range of 475° C. to 575° C. However, the pyrochlore phase has been observed in part of samples of the intrinsic PZT film formed at the plasma potential Vs of approximately 23 V and the film-formation temperature Ts of 475° C. (Therefore, the result of the XRD analysis of the intrinsic PZT film formed at the film-formation temperature Ts of 475° C. is indicated by a filled triangle in FIG. 30.) In addition, disorder of the crystal orientation has begun to appear in the intrinsic PZT film formed at the plasma potential Vs of approximately 23 V and the film-formation temperature Ts of 575° C. (Therefore, the result of the XRD analysis of the intrinsic PZT film formed at the film-formation temperature Ts of 575° C. is also indicated by a filled triangle in FIG. 30.)

Figure 31:
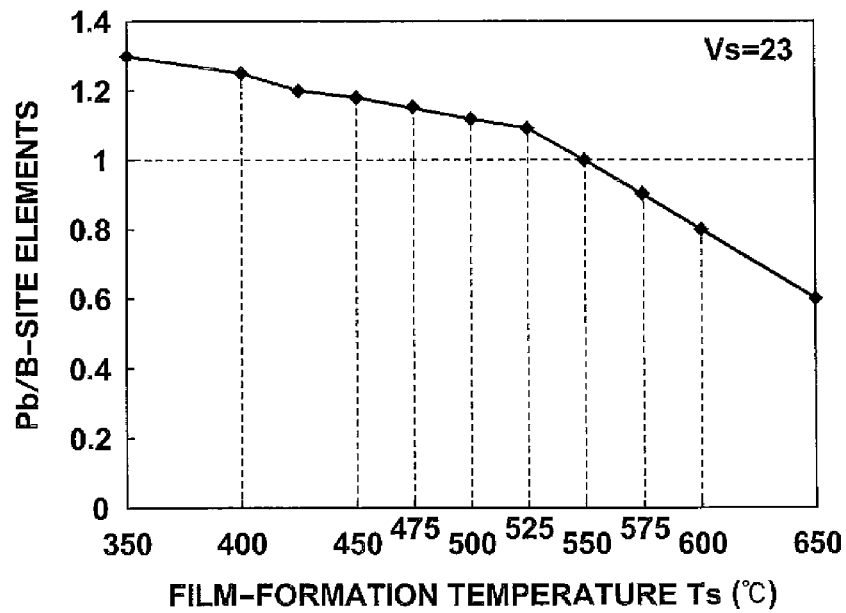
FIG. 31 is a diagram indicating results of composition analysis of the ferroelectric film produced in the experimental example 10.

Further, the compositions of the Nb-PZT film and the intrinsic PZT films are analyzed by XRF (X-ray fluorescence), and the ratio of the molar amount of lead (Pb) to the total molar amount of the B-site elements (i.e., the total molar amount of the Zr and Ti, atoms or the Zr, Ti, and Nb atoms) has been obtained. FIG. 31 shows the results of composition analysis of the Nb-PZT film and the intrinsic PZT films in the experimental example 10.

FIG. 31 indicates that the above ratio of the molar amount of lead (Pb) to the total molar amount of the B-site elements is in the range of 1.0 to 1.3 in the case where the film-formation temperature Ts is in the range of 350° C. to 550° C. under the condition that the plasma potential Vs of is approximately 23 V. That is, it has been confirmed that films of PZT or Nb-PZT can be formed without loss of lead at the film-formation temperature Ts of 350° C. to 550° C. under the condition that the plasma potential Vs of is approximately 23V. However, it has been observed that perovskite crystals cannot grow at the film-formation temperature Ts equal to or lower than 400° C. due to the low film-formation temperature. On the other hand, it has also been observed that perovskite crystals cannot grow at the film-formation temperature Ts equal to or higher than 600° C. due to loss of lead.

For example, the composition of the Nb-PZT film formed at the film-formation temperature Ts of 525° C. under the condition that the plasma potential Vs of is approximately 23 V has been determined to be $Pb_{1.12}Zr_{0.43}Ti_{0.44}Nb_{0.13}O_3$.

After the formation of Nb-PZT film, an upper electrode of platinum (Pt) having a thickness of 100 nm has been formed on each of the plurality of Nb-PZT ferroelectric film by sputtering. Then, the piezoelectric constant $d_{31}$ of the Nb-PZT film has been measured by using the cantilever technique, and determined to be as high as 250 pm/V. That is, the piezoelectric performance of the Nb-PZT film in the experimental example 10 has been confirmed to be satisfactory.

8.13 Summary of Experimental Examples 9 and 10

FIG. 32 is a diagram indicating relationships between the film-formation condition (the film-formation temperature Ts and the plasma potential Vs) and the film characteristics of the intrinsic PZT films and the Nb-PZT films produced by non-thermal equilibrium processes in experimental examples including all the samples in the experimental examples 9 and 10 and other samples formed at various film-formation temperatures and various levels of the plasma potential Vs. In FIG. 32, the abscissa corresponds to the film-formation temperature Ts, and the ordinate corresponds to the plasma potential Vs. In addition, the conditions under which perovskite crystals can grow are indicated as regions encircled by lines.

FIG. 32 shows that when the PZT or Nb-PZT films are formed under a film-formation condition concurrently satisfying the aforementioned inequalities (8) and (9), or the aforementioned inequalities (10) and (11), perovskite crystals containing the pyrochlore phase at most in very small portions can stably grow, and loss of lead (Pb defect) can be stably suppressed, so that a high-quality piezoelectric film having satisfactory crystal structure and composition can stably grow. Although the data indicated in FIG. 32 are obtained from both of the intrinsic PZT films and the Nb-PZT films, the conditions for forming preferable Nb-PZT films are similar to the conditions for forming preferable PZT films.

9. Additional Matters

The ferroelectric film according to the present invention can be preferably used in piezoelectric actuators, ferroelectric memories (FRAMs), and the like, where the piezoelectric actuators may be mounted in the inkjet recording heads, the magnetic recording-and-reproduction heads, MEMS (micro electromechanical systems) devices, micropumps, ultrasonic probes, and the like.

What is claimed is:

1. A ferroelectric film having a columnar structure constituted by a plurality of columnar grains, and containing as a main component a perovskite oxide which has a composition expressed by a compositional formula $A_{1+\delta}[(Zr_xTi_{1-x})_{1-y}M_y]O_z$, where A represents one or more A-site elements including lead (Pb) as a main component, M represents one or more of vanadium (V), niobium (Nb), tantalum (Ta), and antimony (Sb) as one or more B-site elements, zirconium (Zr) and titanium (Ti) are also B-site elements, $0 < x \leq 0.7$, $0.1 \leq y \leq 0.4$, $\delta$ is approximately zero, z is approximately 3, and $\delta$ and z may deviate from 0 and 3, respectively, within ranges of $\delta$ and z in which the composition expressed by the compositional formula $A_{1+\delta}[(Zr_xTi_{1-x})_{1-y}M_y]O_z$ can form a perovskite structure.

2. A ferroelectric film according to claim 1, containing no silicon.

3. A ferroelectric film according to claim 1, wherein $0 < \delta \leq 0.2$.

4. A ferroelectric film according to claim 1, wherein $0.2 \leq y \leq 0.4$.

5. A ferroelectric film according to claim 1, wherein said one or more A-site elements represented by A include bismuth (Bi).

6. A ferroelectric film according to claim 1, having a thickness of 3.0 micrometers or greater.

7. A process for producing said ferroelectric film according to claim 1, wherein said process comprises forming the ferroelectric film by a non-thermal equilibrium process.

8. A process according to claim 7, wherein said non-thermal equilibrium process is sputtering.

9. A process according to claim 8, wherein said ferroelectric film is formed under a condition concurrently satisfying inequalities, $$Ts \geq 400, \text{ and} \tag{1}$$

$$-0.2Ts + 100 < Vs - Vf < -0.2Ts + 130, \tag{2}$$

where Ts represents a film-formation temperature in degrees centigrade, Vs represents in volts a plasma potential in plasma generated during formation of the ferroelectric film, and Vf represents in volts a floating potential in the plasma generated during the formation of the ferroelectric film.

10. A process according to claim 8, wherein said ferroelectric film is formed under a condition concurrently satisfying inequalities, $$Ts \geq 400, \tag{1}$$

$$-0.2Ts + 100 < Vs - Vf < -0.2Ts + 130, \text{ and} \tag{2}$$

$$10 \leq Vs - Vf \leq 35, \tag{3}$$

where Ts represents a film-formation temperature in degrees centigrade, Vs represents in volts a plasma potential in plasma generated during formation of the ferroelectric film, and Vf represents in volts a floating potential in the plasma generated during the formation of the ferroelectric film.

11. A process according to claim 8, wherein said ferroelectric film is formed on a substrate by sputtering under a condition that at least one target is arranged apart from the substrate, the at least one target has a composition corresponding to said composition which the ferroelectric film has, the substrate is held at a temperature of 400° C. or higher, and a plurality of shield elements are arranged apart from the at least one target around a space located on the substrate side of the target in such a manner that the plurality of shield elements are vertically spaced from each other and have such a height that the difference between a floating potential and a plasma potential in plasma generated during formation of the ferroelectric film is equal to or greater than 35 V.

12. A process according to claim 8, wherein said ferroelectric film is formed on a substrate by sputtering which is performed in an arrangement in which at least one target faces the substrate, under a condition that inequalities, $$400 \leq Ts \leq 500, \text{ and} \tag{4}$$

$$30 \leq D \leq 80, \tag{5}$$

are concurrently satisfied, Ts represents a film-formation temperature in degrees centigrade, D represents in millimeters a distance between the substrate and the at least one target, and the at least one target has a composition corresponding to said composition which the ferroelectric film has.

13. A process according to claim 8, wherein said ferroelectric film is formed on a substrate by sputtering which is performed in an arrangement in which at least one target faces the substrate, under a condition that inequalities, $$500 \leq Ts \leq 600, \text{ and} \tag{6}$$

$$30 \leq D \leq 100, \tag{7}$$

are concurrently satisfied, Ts represents a film-formation temperature in degrees centigrade, D represents in millimeters a distance between the substrate and the at least one target, and the at least one target has a composition corresponding to said composition which the ferroelectric film has.

14. A process according to claim 8, wherein said sputtering is performed under the following condition that inequalities, $$400 \leq Ts \leq 475, \text{ and} \tag{8}$$

$$20 \leq Vs \leq 50, \tag{9}$$

are concurrently satisfied, Ts represents a film-formation temperature in degrees centigrade, and Vs represents in volts a plasma potential in plasma generated during formation of the ferroelectric film.

15. A process according to claim 8, wherein said sputtering is performed under the following condition that inequalities, $$475 \leq Ts \leq 600, \text{ and} \tag{10}$$

$$Vs \leq 40, \tag{11}$$

are concurrently satisfied, Ts represents a film-formation temperature in degrees centigrade, and Vs represents in volts a plasma potential in plasma generated during formation of the ferroelectric film.

16. A ferroelectric device comprising:
said ferroelectric film according to claim 1; and
electrodes for applying an electric field to the ferroelectric film.

17. A liquid discharge device comprising:
said ferroelectric device according to claim 16; and
a liquid-discharge member including,
 a liquid-reserve chamber which reserves liquid, and
 a liquid-discharge outlet through which said liquid is externally discharged from the liquid-reserve chamber.

18. The ferroelectric film according to claim 1, wherein the content of the perovskite oxide in the ferroelectric film is 80 wt% or higher.

19. The ferroelectric film according to claim 1, wherein the ferroelectric film is not doped with a sintering assistant or acceptor ions.

* * * * *